(12) United States Patent
Granger-Jones et al.

(10) Patent No.: US 9,048,805 B2
(45) Date of Patent: Jun. 2, 2015

(54) TUNABLE DUPLEXER ARCHITECTURE

(71) Applicant: RF Micro Devices, Inc., Greensboro, NC (US)

(72) Inventors: Marcus Granger-Jones, Scotts Valley, CA (US); Nadim Khlat, Midi-Pyrenees (FR)

(73) Assignee: RF Micro Devices, Inc., Greensboro, NC (US)

( * ) Notice: Subject to any disclaimer, the term of this patent is extended or adjusted under 35 U.S.C. 154(b) by 181 days.

(21) Appl. No.: 13/633,459

(22) Filed: Oct. 2, 2012

(65) Prior Publication Data
US 2013/0083703 A1    Apr. 4, 2013

Related U.S. Application Data

(60) Provisional application No. 61/542,939, filed on Oct. 4, 2011.

(51) Int. Cl.
*H03H 7/01* (2006.01)
*H01P 1/211* (2006.01)
*H01P 1/19* (2006.01)
*H01P 1/213* (2006.01)
*H01P 5/19* (2006.01)

(52) U.S. Cl.
CPC ............. *H03H 7/01* (2013.01); *H03H 7/1775* (2013.01); *H03H 7/1758* (2013.01); *H03H 7/1766* (2013.01); *H01P 1/211* (2013.01); *H01P 1/2138* (2013.01); *H01P 5/19* (2013.01); *H04B 1/525* (2013.01)

(58) Field of Classification Search
CPC ........... H04B 1/525; H03H 7/48; H03H 7/01; H03H 7/1775; H03H 7/1758; H03H 7/175; H03H 7/1766; H04L 25/03878; H04L 5/14; H01P 1/211; H01P 5/19; H01P 1/2138
USPC ........................... 370/254–350; 709/201–213
See application file for complete search history.

(56) References Cited

U.S. PATENT DOCUMENTS 3,593,208 A    7/1971  Smith
4,216,446 A    8/1980  Iwer
(Continued)

OTHER PUBLICATIONS

Non-Final Office Action for U.S. Appl. No. 13/760,159, mailed Aug. 14, 2014, 10 pages.
(Continued)

*Primary Examiner* — Phirin Sam
*Assistant Examiner* — Debebe Asefa
(74) *Attorney, Agent, or Firm* — Withrow & Terranova, P.L.L.C.

(57) ABSTRACT

A tunable radio frequency (RF) duplexer and duplexing methods are disclosed. The tunable RF duplexer includes a first hybrid coupler, a second hybrid coupler, and an RF filter circuit. The first hybrid coupler is operable to split the RF transmission input signal into first and second RF quadrature hybrid transmission signals (QHTSs). The second hybrid coupler is operable to split the RF receive input signal into first and second RF quadrature hybrid receive signals (QHRSs). The RF filter circuit is operable to pass the first and second RF QHTSs to the second hybrid coupler and to reflect the first and second RF QHRSs back to the second hybrid coupler. Additionally, the second hybrid coupler is configured to combine the first and second RF QHTSs into an RF transmission output signal and to combine the first and second RF QHRSs into an RF receive output signal.

25 Claims, 18 Drawing Sheets

(56) References Cited

U.S. PATENT DOCUMENTS

| | | | |
|---|---|---|---|
| 5,180,999 A * | 1/1993 | Edwards | 333/175 |
| 6,484,012 B1 | 11/2002 | Nche et al. | |
| 6,924,715 B2 | 8/2005 | Beaudin et al. | |
| 7,394,333 B2 | 7/2008 | Ezzeddine et al. | |
| 7,741,929 B2 | 6/2010 | Hash | |
| 7,821,355 B2 * | 10/2010 | Engel | 333/117 |
| 7,863,998 B2 | 1/2011 | Rofougaran | |
| 8,243,855 B2 | 8/2012 | Zarei | |
| 8,718,582 B2 | 5/2014 | See et al. | |
| 2002/0136193 A1 | 9/2002 | Chang et al. | |
| 2004/0008082 A1 | 1/2004 | Dow | |
| 2004/0127172 A1 | 7/2004 | Gierkink et al. | |
| 2006/0071714 A1 | 4/2006 | Ramaswamy et al. | |
| 2007/0207748 A1 | 9/2007 | Toncich | |
| 2008/0219389 A1 | 9/2008 | Nisbet | |
| 2008/0290947 A1 | 11/2008 | Dawe | |
| 2009/0221259 A1 | 9/2009 | Shiramizu et al. | |
| 2009/0251618 A1 | 10/2009 | Gao et al. | |
| 2009/0279642 A1 | 11/2009 | Zarei | |
| 2011/0008042 A1 | 1/2011 | Stewart | |
| 2011/0043270 A1 | 2/2011 | Kusuda | |
| 2012/0119842 A1 | 5/2012 | Gu et al. | |
| 2012/0235735 A1 | 9/2012 | Spits et al. | |
| 2013/0028360 A1 | 1/2013 | Rofougaran et al. | |
| 2013/0115998 A1 | 5/2013 | Lamm et al. | |
| 2013/0165067 A1 | 6/2013 | DeVries et al. | |
| 2013/0273860 A1 | 10/2013 | Pehlke | |
| 2014/0192727 A1 | 7/2014 | Liu et al. | |
| 2014/0288723 A1 | 9/2014 | Persson | |

OTHER PUBLICATIONS

Non-Final Office Action for U.S. Appl. No. 13/760,201, mailed Aug. 28, 2014, 9 pages.

Non-Final Office Action for U.S. Appl. No. 13/760,240, mailed Aug. 27, 2014, 13 pages.

Andrews, David, "Chapter 5: Practical Design," Lumped Element Quadrature Hybrids, Copyright: 2006, pp. 129-135, Artech House, Inc., Norwood, Massachusetts.

Fisher, R.E., "Broad-Band Twisted-Wire Quadrature Hybrids," IEEE Transactions on Microwave Theory and Techniques, vol. 21, Issue 5, May 1973, pp. 355-357.

Monteath, G.D., "Coupled Transmission Lines as Symmetrical Directional Couplers," Proceedings of the IEE—Part B: Radio and Electronic Engineering, vol. 102, Issue 3, May 1955, pp. 383-392.

Vizmuller, Peter, "Chapter 2: Circuit Examples," RF Design Guide: Systems, Circuits, and Equations, Copyright: 1995, pp. 95-98, Artech House, Inc., Norwood, Massachusetts.

Zybura, Michael F. et al., "Combined Balun Transformer and Harmonic Filter," U.S. Appl. No. 61/555,311, filed Nov. 3, 2011, 9 pages.

Andrews, David, "Chapter 4: Passive Synthesis," Lumped Element Quadrature Hybrids, Copyright: 2006, pp. 79-81, Artech House, Inc., Norwood, Massachusetts.

Young, L. et al., "A high power diplexing filter," IRE Transactions on Microwave Theory and Techniques, Jul. 1959, pp. 384-387.

Rizzi, P., "Microwave engineering: passive circuits," Prentice Hall, Englewood Cliffs, New Jersey, 1988, pp. 504-507.

Wen, J. et al., "Suppression of reflection coefficients of surface acoustic wave filters using quadrature hybrids," IEEE Transactions on Ultrasonics, Ferroelectrics, and Frequency Controls, vol. 53, No. 10, Oct. 2006, pp. 1912-1917.

Notice of Allowance for U.S. Appl. No. 13/760,159, mailed Jan. 14, 2015, 6 pages.

Non-Final Office Action for U.S. Appl. No. 13/925,891, mailed Jan. 16, 2015, 10 pages.

Notice of Allowance for U.S. Appl. No. 13/760,201, mailed Feb. 27, 2015, 8 pages.

Notice of Allowance for U.S. Appl. No. 13/760,240, mailed Mar. 4, 2015, 8 pages.

* cited by examiner

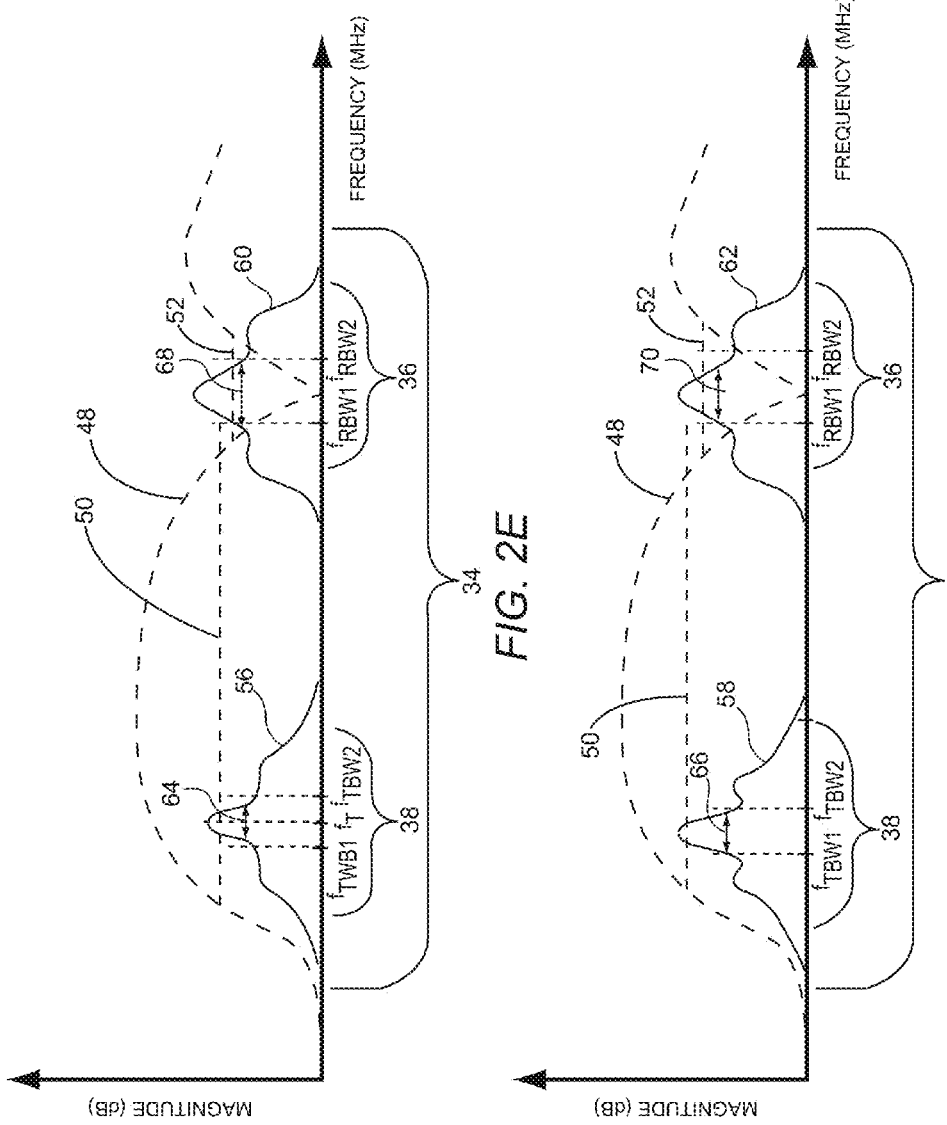

TUNABLE DUPLEXER ARCHITECTURE

RELATED APPLICATIONS

This application claims the benefit of U.S. provisional patent application No. 61/542,939, filed Oct. 4, 2011, the disclosure of which is incorporated herein by reference in its entirety.

FIELD OF THE DISCLOSURE

This disclosure relates generally to radio frequency (RF) duplexers and duplexing methods related to RF front-end modules.

BACKGROUND

A duplexer is a device that facilitates bi-directional communication (i.e., simultaneous reception and transmission) by a common antenna. In order to facilitate simultaneous reception and transmission of signals over the antenna, the duplexer needs to be designed for operation at both receive and transmission bands while providing adequate isolation between receive and transmission signals. To provide multi-mode and multi-band operation, radio frequency (RF) duplexers often use multiple parallel duplexer components selected using an ever-growing number of switches. As such, this type of RF duplexer solution presents ever-increasing demands with regard to cost and size.

Accordingly, more adaptable RF duplexers are needed to provide multi-band/multi-mode operations that do not require increases in cost and size.

SUMMARY

Embodiments of a tunable radio frequency (RF) duplexer and methods of duplexing transmission and receive signals are disclosed. In one embodiment, an RF transmission input signal is split into a first RF quadrature hybrid transmission signal (QHTS) and a second RF QHTS. The first RF QHTS and the second RF QHTS are filtered to pass the first RF QHTS and the second RF QHTS within a passband. The first RF QHTS and the second RF QHTS within the passband are then combined into an RF transmission output signal. In this manner, the RF transmission output signal may be provided to an antenna by the tunable RF duplexer, while the tunable RF duplexer receives the RF transmission input signal from a transmission chain.

With regard to the RF receive input signal intercepted on the antenna, the RF receive input signal is split into a first RF quadrature hybrid receive signal (QHRS) and a second RF QHRS. The first RF QHRS and the second RF QHRS are filtered to reflect the first RF QHRS and the second RF QHTS within a stopband. The first RF QHRS and the second RF QHRS are combined within the stopband into an RF receive output signal. In this manner, the RF receive output signal may be provided to a receive chain by the tunable RF duplexer, while the tunable RF duplexer receives the RF receive input signal intercepted by the antenna.

In one embodiment of the tunable RF duplexer, the tunable RF duplexer includes a first hybrid coupler, a second hybrid coupler, and an RF filter circuit. The first hybrid coupler is operable to split the RF transmission input signal from a power amplifier into the first RF QHTS and the second RF QHTS. The second hybrid coupler is operable to split the RF receive input signal from an antenna into the first RF QHRS and the second RF QHRS. The RF filter circuit is operable to pass the first RF QHTS and the second RF QHTS to the second hybrid coupler and to reflect the first RF QHRS and the second RF QHRS back to the second hybrid coupler. In this manner, the second hybrid coupler is configured to combine the first RF QHTS and the second RF QHTS into the RF transmission output signal, and to combine the first RF QHRS and the second RF QHRS into the RF receive output signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 2E is a frequency domain representation of one embodiment of a first RF quadrature hybrid transmission signal (QHTS) provided by splitting the RF transmission input signal, and a first RF quadrature hybrid receive signal (QHRS) provided by splitting the RF receive input signal.

FIG. 2F is a frequency domain representation of one embodiment of a second RF QHTS provided by splitting the RF transmission input signal and a second RF QHRS provided by splitting the RF receive input signal.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
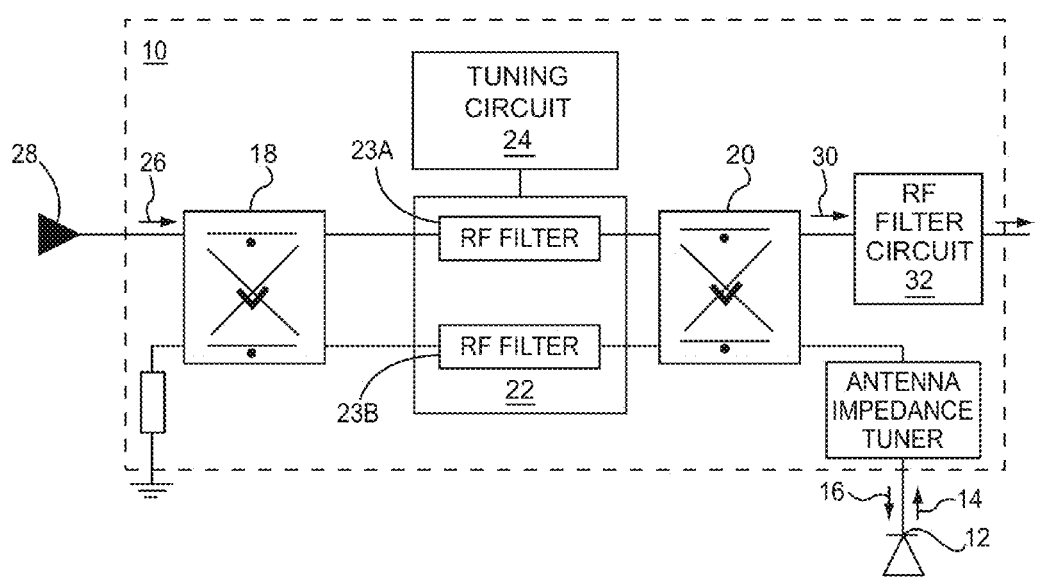
FIG. 1 illustrates one embodiment of a tunable radio frequency (RF) duplexer.

FIG. 1 illustrates an embodiment of a tunable radio frequency (RF) duplexer 10. An antenna 12 is operably associated with the tunable RF duplexer 10 and is capable of radiating RF transmission signals and absorbing radiated RF receive signals. In order to prevent out-of-band noise and spurious emissions from distorting RF receive and transmission signals, the tunable RF duplexer 10 provides isolation between RF transmission signals and RF receive signals as well as out-of-band filtering. Accordingly, the tunable RF duplexer 10 allows for an RF receive input signal 14 to be received by the antenna 12 while simultaneously outputting an RF transmission output signal 16 from the antenna 12.

In this embodiment, the tunable RF duplexer 10 includes a first hybrid coupler 18, a second hybrid coupler 20, an RF filter circuit 22, and a tuning circuit 24. The first hybrid coupler 18 receives an RF transmission input signal 26 from upstream circuitry. For example, the RF transmission input signal 26 is received from a power amplifier 28 upstream from the tunable RF duplexer 10. An RF receive output signal 30 is provided by the second hybrid coupler 20. The RF receive output signal 30 is filtered by a second RF filter circuit 32 and output to downstream circuitry, such as baseband circuitry. As explained in further detail below, the first hybrid coupler 18, the RF filter circuit 22, and the second hybrid coupler 20 provide the appropriate isolation between receive and transmission. The RF filter circuit 22 includes an RF filter 23A across its top ports and an RF filter 23B across its bottom ports. Thus, the RF filter circuit 22 is a four-port network. However, the RF filter 23A and the RF filter 23B are independent of one another and each of the RF filters 23A, 23B operates as a two-port network. Also, the RF filter 23A and the RF filter 23B may be identical, and thus may each have the same individual frequency response.

Figure 2:
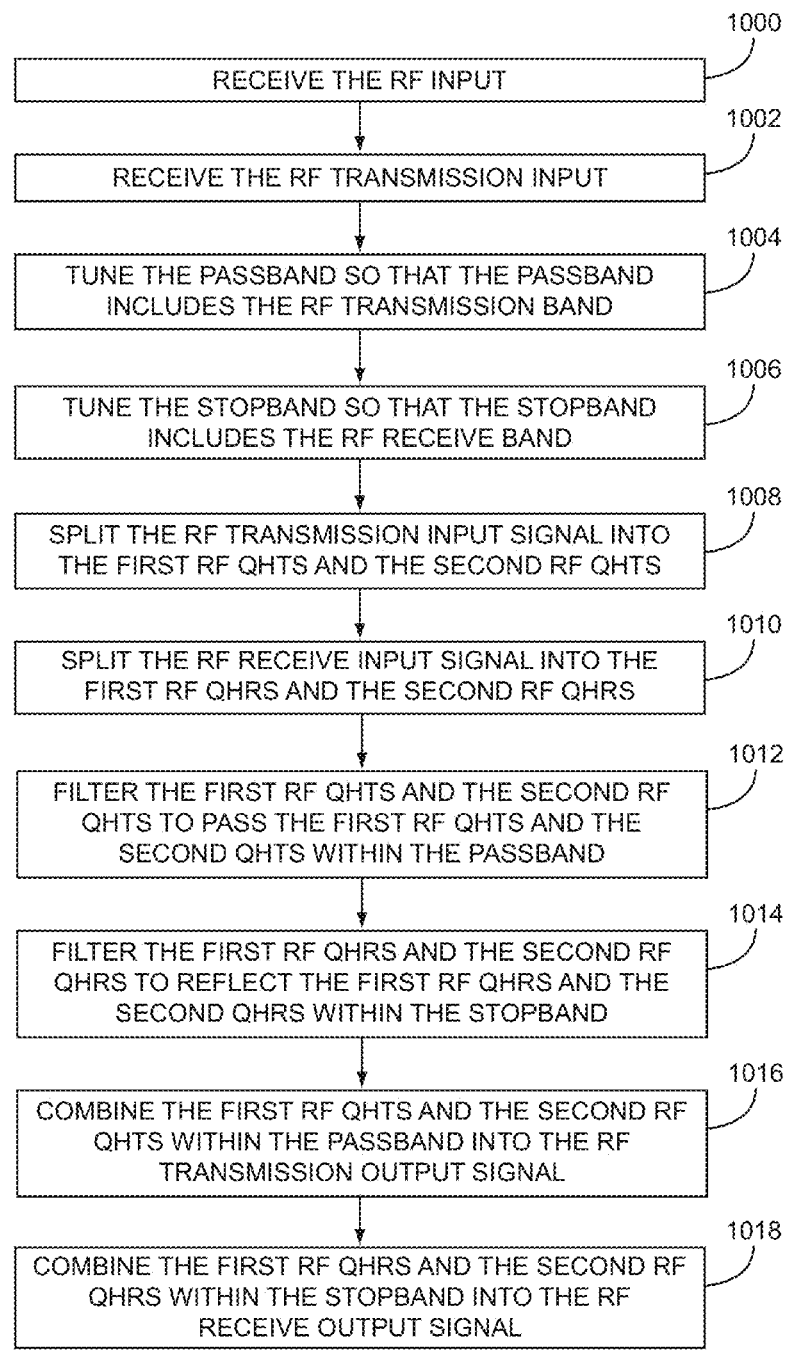
FIG. 2 illustrates exemplary procedures that may be implemented by the tunable RF duplexer shown in FIG. 1 so that the tunable RF duplexer may simultaneously receive an RF transmission input signal from a transmission chain while transmitting an RF transmission output signal to an antenna, and may receive an RF receive input signal intercepted on the antenna while providing an RF receive output signal to a receive chain.

FIG. 2 illustrates exemplary procedures that may be implemented to provide RF duplexing. As explained in further detail below, the procedures described in FIG. 2 are implemented by the tunable RF duplexer 10 shown in FIG. 1. Different embodiments of these exemplary procedures may be implemented depending on a particular component structure of an RF duplexer 10. Furthermore, the order in which the procedures are presented is not intended to imply a required sequence for the procedures. Rather, the procedures may be implemented in a different sequence and/or some or all of the procedures may be implemented simultaneously.

As shown in FIG. 2, the tunable RF duplexer 10 receives the RF receive input signal 14 (procedure 1000). The RF receive input signal 14 was initially intercepted by the antenna 12. Additionally, the tunable RF duplexer 10 receives the RF transmission input signal 26 from an upstream transceiver chain (procedure 1002). For example, the RF transmission input signal 26 is received by the tunable RF duplexer 10 from the power amplifier 28. The power amplifier 28 transfers power into the RF transmission input signal 26 so that the RF transmission output signal 16 has a sufficiently high spectral density for external propagation from the antenna 12.

Figure 2A:
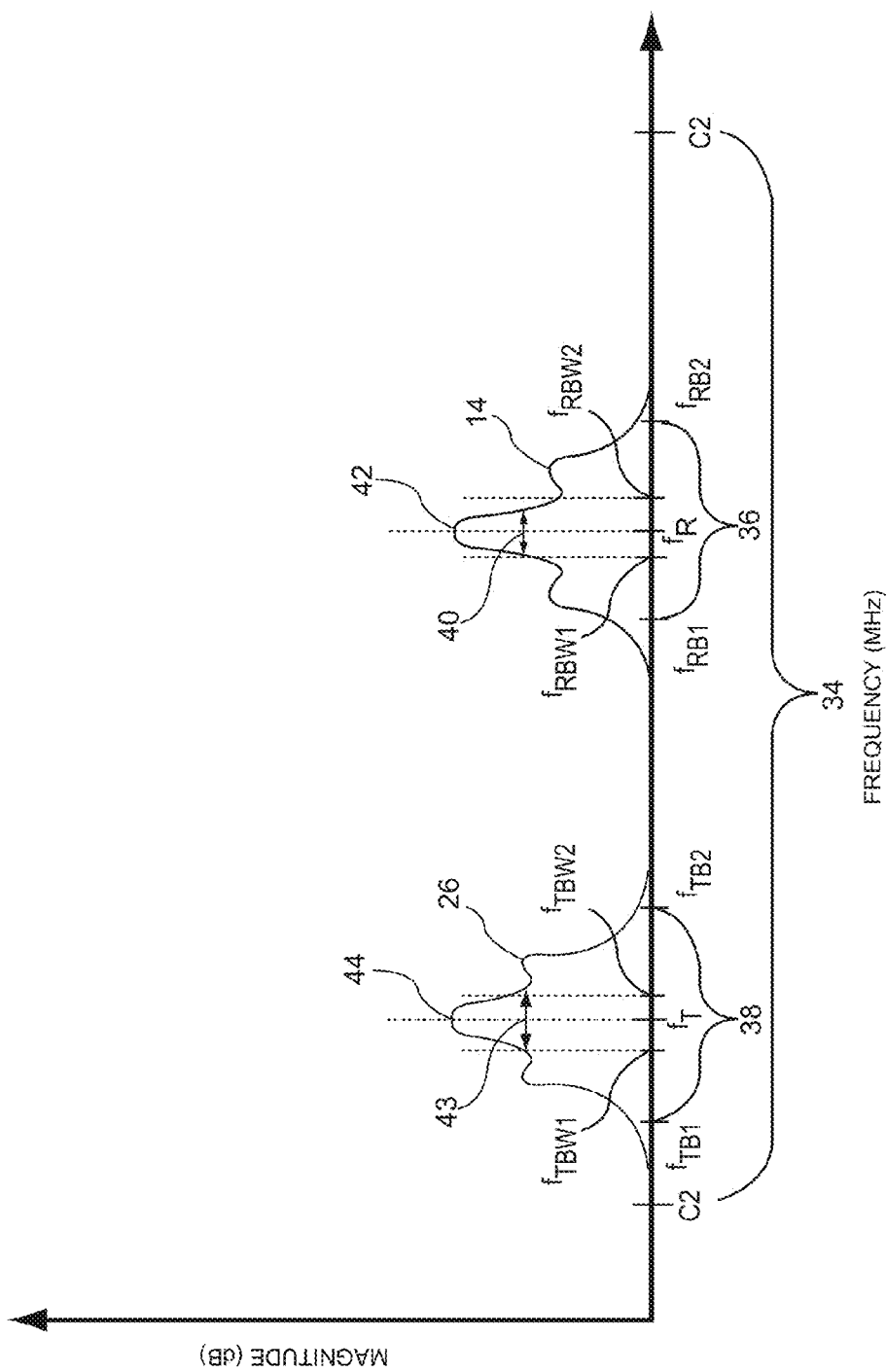
FIG. 2A is a frequency domain representation of one embodiment of an RF receive input signal that operates within an RF receive band and an RF transmission output signal that operates within an RF transmission band.

FIG. 2A illustrates a graph of one embodiment of the RF receive input signal 14 and the RF transmission input signal 26 in the frequency domain. Both the RF receive input signal 14 and the RF transmission input signal 26 operate in an RF communication band 34. In this embodiment, the RF communication band 34 is the set of frequencies between a cutoff frequency C1 and a cutoff frequency C2. Additionally, an RF receive band 36 and an RF transmission band 38 are defined within the RF communication band 34. The RF transmission band 38 is defined as the set of frequencies between a cutoff frequency $f_{TB1}$ and a cutoff frequency $f_{TB2}$. Similarly, the RF receive band 36 is defined as the set of frequencies between a cutoff frequency $f_{RB1}$ and a cutoff frequency $f_{RB2}$. The RF receive input signal 14 operates in the RF receive band 36 of the RF communication band 34.

In this example, a signal bandwidth 40 of the RF receive input signal 14 is the set of frequencies that correspond to the portion of the RF receive input signal 14 within 3 dB of a maximum magnitude 42. The RF receive input signal 14 shown in FIG. 2A operates at a frequency $f_R$. This frequency $f_R$ corresponds to the maximum magnitude 42 of the RF receive input signal 14. For example, the frequency $f_R$ may be a carrier frequency of the RF receive input signal 14. The signal bandwidth 40 reaches a cutoff frequency $f_{RBW1}$, since the frequency $f_{RBW1}$ corresponds to a value of the RF receive input signal 14 that is 3 dB from the maximum magnitude 42. The signal bandwidth 40 reaches a cutoff frequency f because the cutoff frequency $f_{RBW2}$ corresponds to a value of the RF receive input signal 14 that is 3 dB from the maximum magnitude 42.

With regard to the RF transmission input signal 26, the RF transmission input signal 26 operates in the RF transmission band 38. More specifically, a signal bandwidth 43 of the RF transmission input signal 26 is within the RF transmission band 38. A maximum magnitude 44 of the RF transmission input signal 26 is placed at the frequency $f_T$. A cutoff frequency $f_{TBW1}$ of the signal bandwidth 43 corresponds to a value of the RF transmission input signal 26 at 3 dB from the maximum magnitude 44. Similarly, a cutoff frequency $f_{TBW2}$ corresponds to a value of the RF transmission input signal 26 that is 3 dB from the maximum magnitude 44. The RF transmission input signal 26 may be said to operate at the frequency $f_T$ since the frequency $f_T$ is a carrier or a center frequency.

Portions of the RF receive input signal 14 and the RF transmission input signal 26 outside of their respective signal bandwidths 40, 43 may be considered spurious emissions. In other words, the portions of the RF receive input signal 14 and the RF transmission input signal 26 may be reduced or eliminated without affecting the corresponding information or data in the RF transmission input signal 26 and the RF receive input signal 14. Spurious emissions include parasitic emissions, intermodulation, interference, harmonic emissions, and frequency conversion products. The signal bandwidth 40 and the signal bandwidth 43 are defined as 3 dB bandwidths for pragmatic purposes. Generally speaking, at least for the types of signals being shown in FIG. 2A, the signal bandwidths 40, 43 are measured by finding 3 dB magnitudes from the maximum magnitudes 42, 44, as explained above. However, more accurately, a necessary signal bandwidth is an exact amount of signal bandwidth required to carry the information or data of a signal. Anything outside of this necessary bandwidth would be considered spurious emissions. Thus, the signal bandwidth 40 and the signal bandwidth 43 may or may not include a small portion of the spurious emissions. The necessary signal bandwidths may be slightly smaller or slightly greater than the signal bandwidths 40 and 43.

Finally, it should be noted that the RF receive input signal 14 and the RF transmission input signal 26 are each narrow-band signals. Accordingly, the RF receive input signal 14 and the RF transmission input signal 26 may represent time division multiplexing (TDM) signals, frequency division multiplexing (FDM) signals, space division multiplexing (SDM) signals, and/or the like. Accordingly, these narrow-band signals may be said to operate at a particular frequency, which for the RF receive input signal 14 is the frequency $f_R$ and for the RF transmission input signal 26 is the frequency $f_T$. The RF receive band 36 is thus an RF receive channel within the RF communication band 34, while the RF transmission band 38 is an RF transmission channel within the RF communication band 34.

However, this disclosure is not limited to narrow-band signals and the examples given in FIG. 2A and throughout this disclosure are not intended to be limited in this manner. Rather, embodiments of the tunable RF duplexer 10 and the method shown in FIG. 2 may be provided for wide-band signals, and also for both wide-band and narrow-band signals. With wide-band signals, such as orthogonal frequency division multiple access (OFDMA) signals or Code Division Multiple Access (CDMA) signals, information or data is coded and spread across a larger portion of the spectrum. Thus, there would be no signal with a single carrier frequency that has all of the information or data, but rather there may be various carriers carrying different coded portions of the information. As such, the RF transmission band 38 for this type of RF transmission input signal 26 may include various RF transmission channels. Similarly, the RF receive band 36 may include various RF receive channels. With CDMA signals and other wide-band spectrum signals, it is more practical to define the bandwidths by simply using the necessary bandwidth, as is known in the art.

Figure 2B:
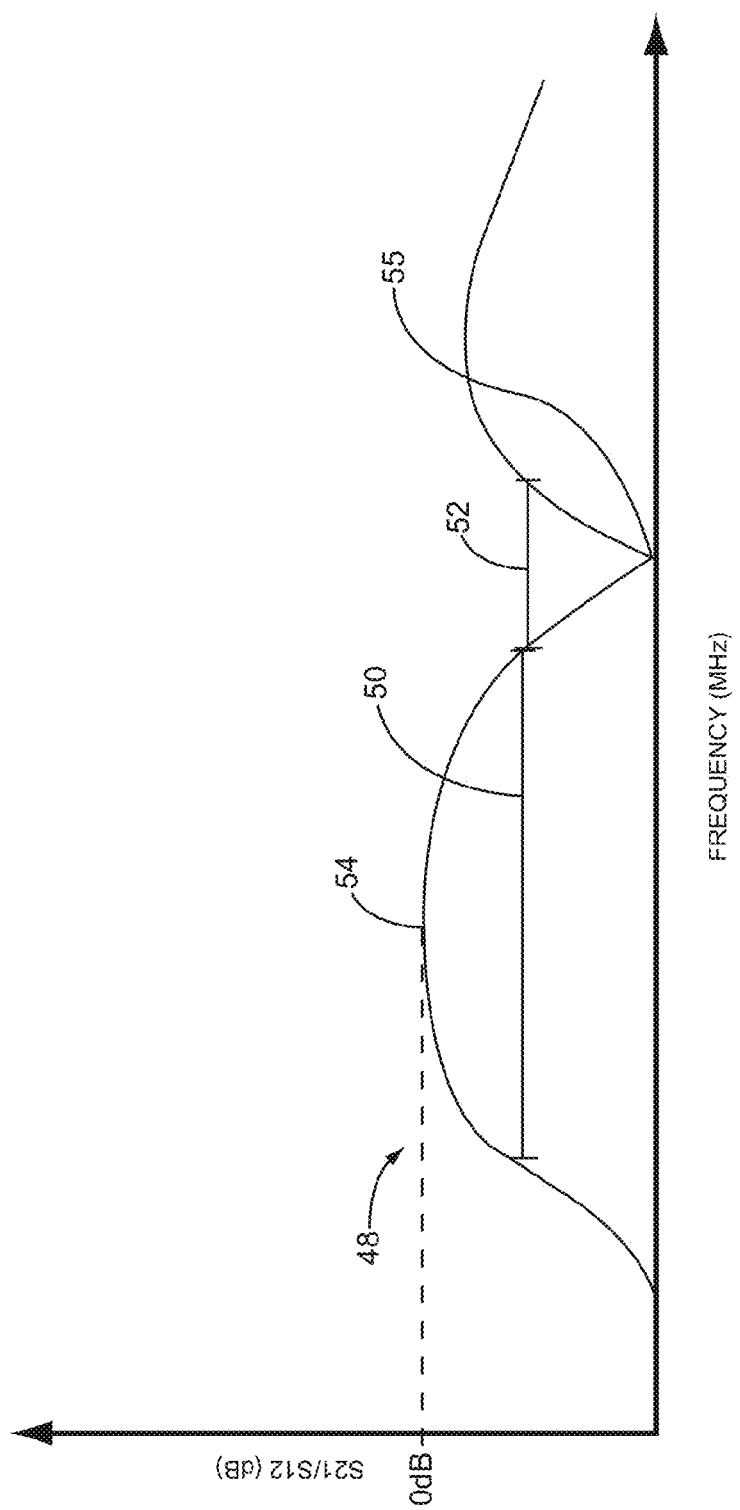
FIG. 2B is a frequency domain representation of a frequency response as S21 and S12 parameters provided by an RF filter circuit in the tunable RF duplexer shown in FIG. 1, wherein the frequency response defines a passband and a stopband.

FIG. 2B illustrates one embodiment of a frequency response 48 provided by the RF filter circuit 22. In FIG. 2B, the frequency response 48 represents S21 and S12 parameters of each of the RF filters 23A, 23B (shown in FIG. 1) individually, as a function of frequency. Thus, the two-port S21 and S12 parameter of the RF filter 23A is represented by the frequency response 48 in FIG. 2C. Since the RF filter 23B is identical to the RF filter 23A, the two-port S21 and S12 parameter of the RF filter 23B is also represented by the frequency response 48 in FIG. 2C. The two-port S21 and S12 parameter represents the forward and reverse transmission of the RF filters 23A, 23B, as a function of frequency. A passband 50 corresponds to S21/S12 values in the frequency response 48 that are within 3 dB of a maxima 54. A stopband 52 is determined relative to a minima 55. The maxima 54 and the minima 55 are set by the poles and zeros of the frequency response 48. The stopband 52 is a set of frequencies that correspond to S21/S12 values within 3 dB of the minima 55. In this embodiment, the frequency response 48 defines the stopband 52 as a notch. As explained in further detail below, the RF filter circuit 22 is tunable so as to shift the passband 50 and the stopband 52. Thus, by tuning the RF filter circuit 22, the frequency response 48 may be transposed, so that the passband 50 and the stopband 52 are provided at the desired frequency bands.

Figure 2C:
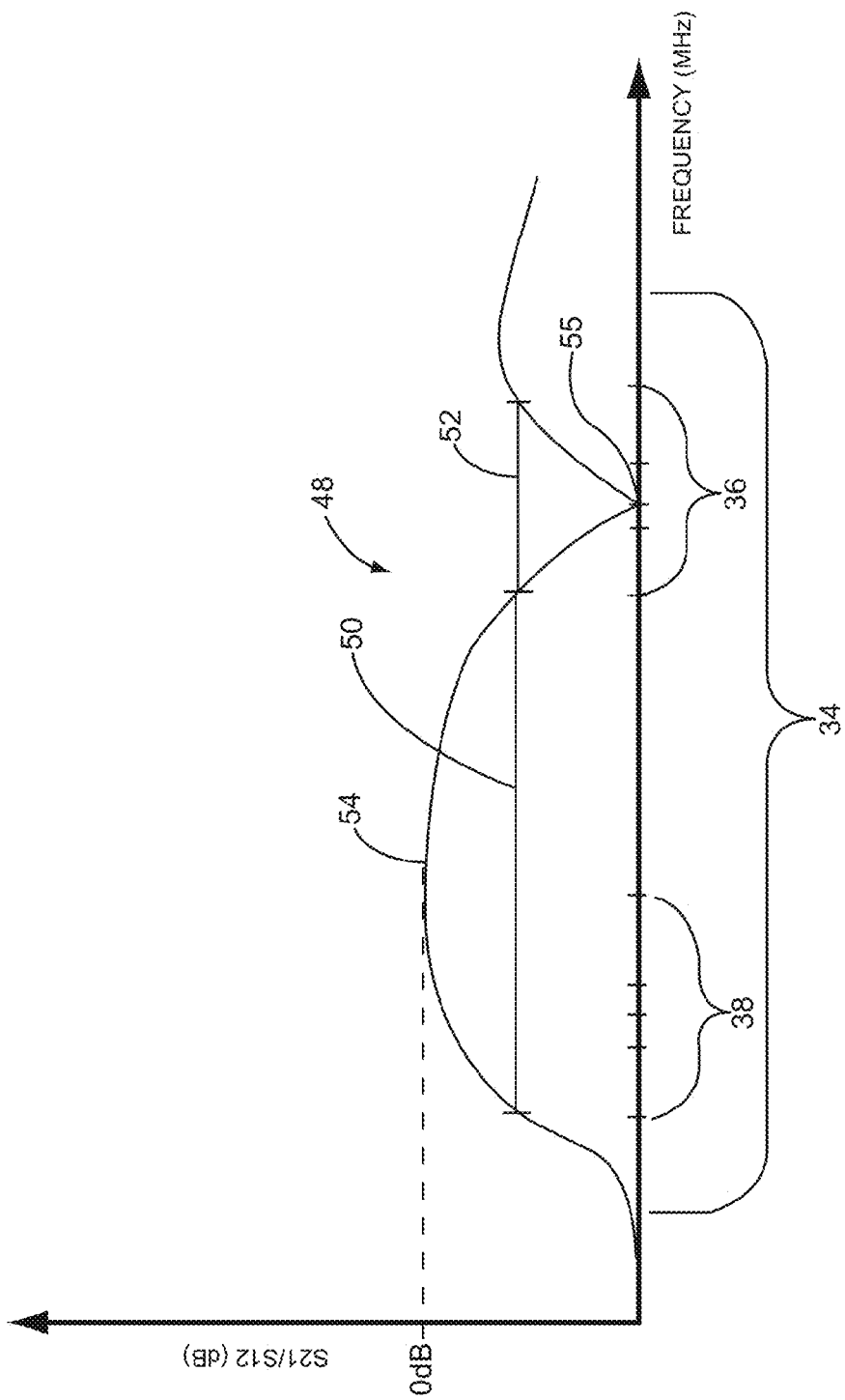
FIG. 2C illustrates the frequency response shown in FIG. 2B after the passband has been shifted to include the RF transmission band shown in FIG. 2A and the stopband has been shifted to include the RF receive band shown in FIG. 2A.

FIG. 2C illustrates the frequency response 48 once the passband 50 is shifted to include the RF transmission band 38, and once the stopband 52 is shifted to include the RF receive band 36. As shown in FIG. 2C, the tuning circuit 24 tunes the passband 50 so that the passband 50 includes the RF transmission band 38 (procedure 1004). The tuning circuit 24 may also tunes the stopband 52 so that the stopband 52 includes the RF receive band 36 (procedure 1006). In this manner, signals that operate in the RF transmission band 38 are passed by the RF filter circuit 22, while signals that operate in the RF receive band 36 are blocked by the RF filter circuit 22.

Figure 2D:
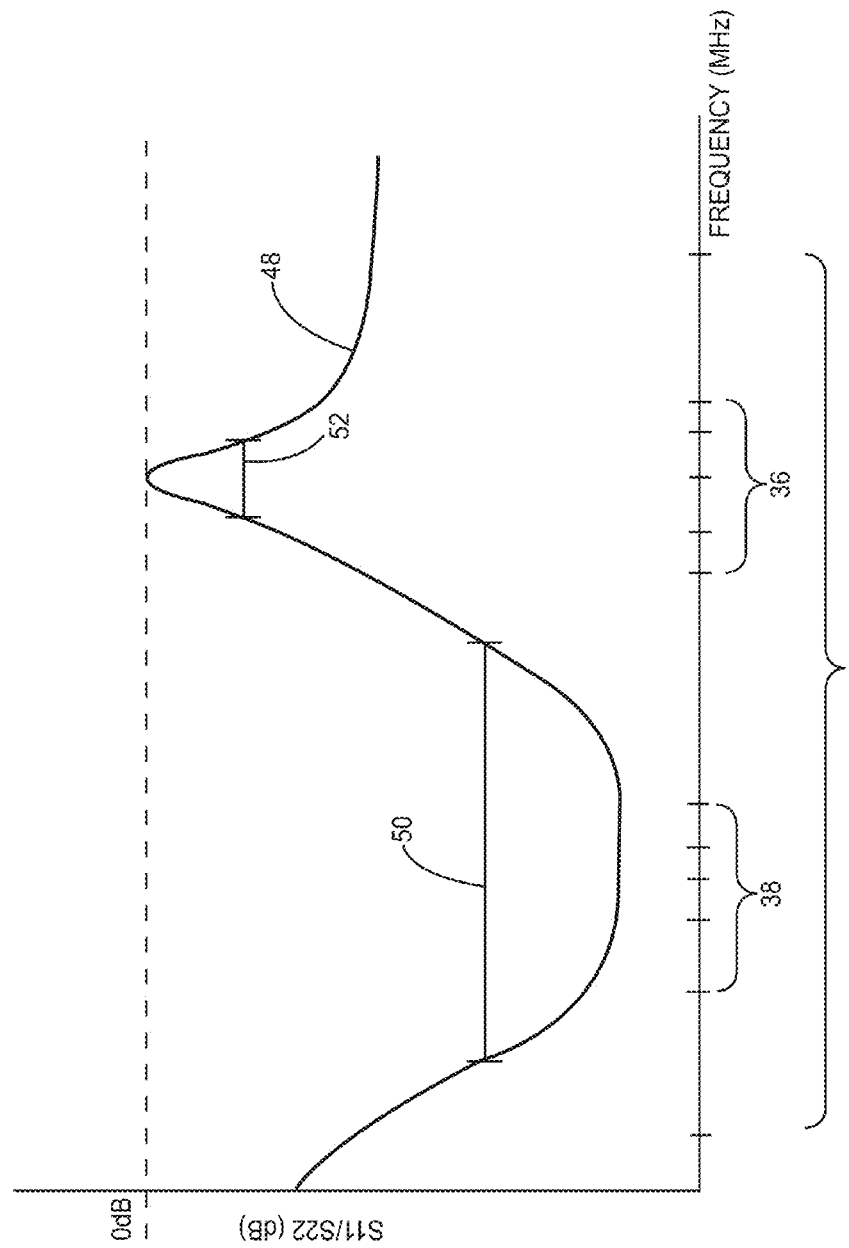
FIG. 2D illustrates the frequency response of the RF filter circuit as S11 and S22 parameters.

FIG. 2D illustrates the frequency response 48 once the passband 50 is shifted to include the RF transmission band 38, and once the stopband 52 is shifted to include the RF receive band 36. However, in FIG. 2D, the frequency response 48 represents S11 and S22 parameters of each of the RF filters 23A, 23B (shown in FIG. 1) individually, as a function of frequency. Thus, the two-port S11 and S22 parameter of the RF filter 23A is represented by the frequency response 48 in FIG. 2C. Since the RF filter 23B is identical to the RF filter 23A, the two-port S11 and S22 parameter of the RF filter 23B is also represented by the frequency response 48 in FIG. 2C. The two-port S11 and S22 parameter represents the forward and reverse return loss of the RF filters 23A, 23B, as a function of frequency. Note that in this embodiment, the S11/S22 values of the stopband 52 are at or near zero (0) dB in the RF receive band 36. By placing the stopband 52 at or near zero (0) dB, reflections in the stopband 52 are maximized, while the insertion losses within the RF receive band 36 are minimized. Filtering thus removes noise outside of the RF receive band 36 while minimizing losses of reflected signals.

Referring now to FIGS. 2E and 2F, the RF transmission input signal 26 is split into a first RF quadrature hybrid transmission signal (QHTS) 56 and a second RF QHTS 58 (procedure 1008). As such, the first RF QHTS 56 is 90 degrees or $\pi/2$ radians out of phase with the second RF QHTS 58. Also, the RF receive input signal 14 is also split into a first RF quadrature hybrid receive signal (QHRS) 60 and a second RF QHRS 62 (procedure 1010). FIGS. 2E and 2F illustrate the first RF QHTS 56 and the second RF QHTS 58. The first RF QHTS 56 and the second RF QHTS 58 have substantially identical magnitude characteristics as the first RF transmission input signal 26. However, both the first RF QHTS 56 and the second RF QHTS 58 have a power spectral density that is at a power ratio of the power spectral density of the RF transmission input signal 26. In this example, the power ratio is 3 dB, and thus the first RF QHTS 56 and the second RF QHTS 58 have approximately one half of the power of the RF transmission input signal 26. The first RF QHTS 56 and the second RF QHTS 58 are quadrature hybrids, since there is approximately a 90-degree or π/2 radians phase difference between the signals. As explained in further detail below, the first hybrid coupler 18 splits the RF transmission input signal 26 into the first RF QHTS 56 and the second RF QHTS 58.

Of course, non-ideal characteristics of the tunable RF duplexer 10, such as parasitic impedances, may result in the first RF QHTS 56 and the second RF QHTS 58 to be slightly unbalanced with respect to one another, or to have slightly less than half the power of the RF transmission input signal 26. Also, non-ideal characteristics can result in the phase difference between the first RF QHTS 56 and the second RF QHTS 58 fluctuating somewhat from a 90-degree or π/2 radians phase difference. These types of errors are acceptable so long as the first RF QHTS 56 and the second RF QHTS 58 can be combined into the RF transmission output signal 16, such that the RF transmission output signal 16 complies with spectrum requirements for the RF communication band 34.

Again referring to FIG. 2 and FIGS. 2E and 2F, the second hybrid coupler 20 splits the RF receive input signal 14 into the first RF QHRS 60 and the second RF QHRS 62. Both the first RF QHRS 60 and the second RF QHRS 62 have essentially the same form as the RF receive input signal 14. However, a spectral density of the first RF QHRS 60 and the second RF QHRS 62 is at a power ratio with respect to a power spectral density of the RF receive input signal 14. In this example, the power ratio is a 3 dB power ratio, and thus the first RF QHRS 60 and the second RF QHRS 62 are at about half power with respect to the RF receive input signal 14. The first RF QHRS 60 and the second RF QHRS 62 are quadrature hybrids, because each has a 90-degree or π/2 radians phase difference with respect to the other. Non-ideal characteristics of the second hybrid coupler 20, such as parasitic impedances, may result in the first RF QHRS 60 and the second RF QHRS 62 having slightly lower power ratios with respect to the RF receive input signal 14. These non-ideal characteristics may also result in the first RF QHRS 60 and the second RF QHRS 62 being slightly unbalanced. Furthermore, the phase difference between the first RF QHRS 60 and the second RF QHRS 62 may vary slightly due to non-ideal characteristics of the tunable RF duplexer 10. These variations in both power and magnitude are acceptable, so long as the first RF QHRS 60 and the second RF QHRS 62 can combine into the RF receive output signal 30 and comply with spectral requirements for the RF communication band 34.

Since the RF transmission input signal 26 is split into the first RF QHTS 56 and the second RF QHTS 58, both the first RF QHTS 56 and the second RF QHTS 58 operate in the RF transmission band 38 of the RF communication band 34. When the first hybrid coupler 18 outputs the first RF QHTS 56 and the second RF QHTS 58, the RF filter circuit 22 filters the first RF QHTS 56 and the second RF QHTS 58 to pass the first RF QHTS 56 and the second RF QHTS 58 within the passband 50 (procedure 1012). As shown in FIGS. 2E and 2F, the frequency response 48 of the RF filter circuit 22 has been transposed so that the passband 50 and the stopband 52 are shifted into the RF communication band 34. More particularly, the passband 50 is shifted so that the RF transmission band 38 is in the passband 50.

The stopband 52 has been shifted so that the RF receive band 36 is in the stopband 52. Since the first RF QHTS 56 and the second RF QHTS 58 are within the passband 50, the RF filter circuit 22 is configured to pass the first RF QHTS 56 and the second RF QHTS 58 to the second hybrid coupler 20. When the second hybrid coupler 20 outputs the first RF QHRS 60 and the second RF QHRS 62, the RF filter circuit 22 filters the first RF QHRS 60 and the second RF QHRS 62 to reflect the first RF QHRS 60 and the second RF QHRS 62 within the stopband 52 (procedure 1014). The first RF QHRS 60 and the second RF QHRS 62 operate within the RF receive band 36. Since the stopband 52 is in the RF receive band 36, the RF filter circuit 22 has been tuned to block the first RF QHRS 60 and the second RF QHRS 62.

As shown in FIGS. 2E and 2F, the first RF QHTS 56 has a signal bandwidth 64 and the second RF QHTS 58 has a signal bandwidth 66. Although the first RF QHTS 56 and the second RF QHTS 58 have approximately half the spectral power density (excluding losses) of the RF transmission input signal 26 shown in FIG. 2A, the signal bandwidth 64 of the first RF QHTS 56 and the signal bandwidth 66 of the second RF QHTS 58 have approximately the same size and are located at approximately the same frequencies. In FIGS. 2E and 2F, the signal bandwidth 64 of the first RF QHTS 56 and the signal bandwidth 66 of the second RF QHTS 58 are between the frequencies $f_{TBW1}$ and $f_{TBW2}$. However, non-ideal circuit behavior may result in either slight misalignments and/or slight size differences in the signal bandwidth 64 and the signal bandwidth 66. The amount of error that is permissible may depend on the particular application and spectrum requirements. The tuning circuit 24 is configured to tune the frequency response 48 of the RF filter circuit 22 so that the signal bandwidth 64 of the first RF QHTS 56 and the signal bandwidth 66 of the second RF QHTS 58 are each within the passband 50. Thus, the RF filter circuit 22 filters the first RF QHTS 56 and the second RF QHTS 58 to pass the first RF QHTS 56 and the second RF QHTS 58 within the passband 50 to the second hybrid coupler 20.

As shown in FIGS. 2E and 2F, the first RF QHRS 60 has a signal bandwidth 68, while the second RF QHRS 62 has a signal bandwidth 70. Although the first RF QHRS 60 and the second RF QHRS 62 have approximately half the power spectral density of the RF receive input signal 14 (excluding losses), the signal bandwidth 68 of the first RF QHRS 60 and the signal bandwidth 70 of the second RF QHRS 62 are configured to be approximately the same as the signal bandwidth 40 of the RF receive input signal 14. In the embodiments illustrated in FIGS. 2E and 2F, the signal bandwidth 68 and the signal bandwidth 70 are both between the frequencies $f_{RBW1}$ and $f_{RBW2}$. However, non-ideal circuit behavior may result in slight misalignments or size differences in the signal bandwidth 68 and the signal bandwidth 70. The amount of error that is permissible may depend on the particular application and spectrum requirements. The tuning circuit 24 is configured to tune the frequency response 48 of the RF filter circuit 22 so that the signal bandwidth 68 of the first RF QHRS 60 and the signal bandwidth 70 of the second RF QHRS 62 are each within the stopband 52. In this manner, the RF filter circuit 22 blocks the first RF QHRS 60 and the second RF QHRS 62 such that the first RF QHRS 60 and the second RF QHRS 62 are reflected back to the second hybrid coupler 20.

Figure 2G:
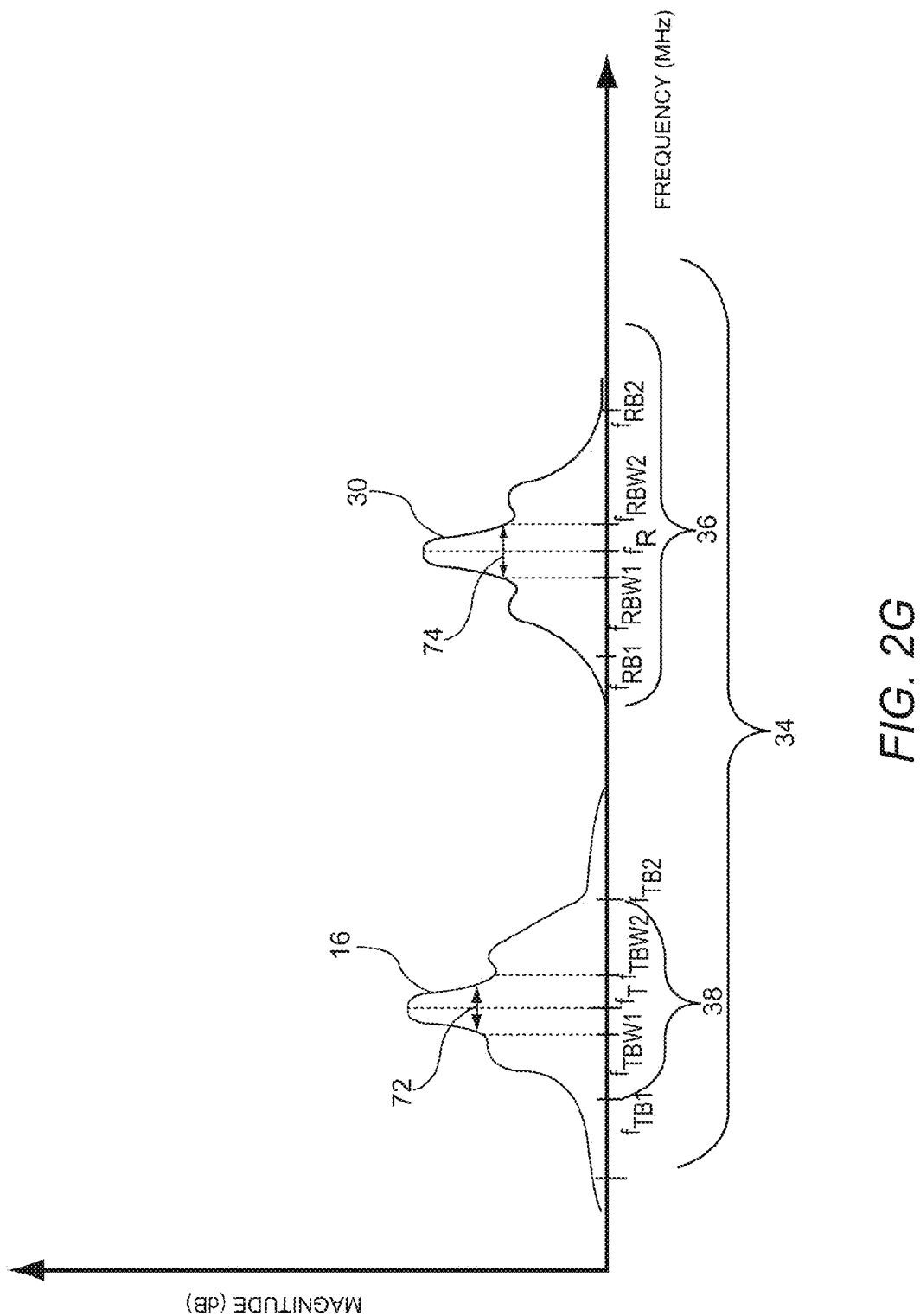
FIG. 2G is a frequency domain representation of one embodiment of the RF transmission output signal provided as a result of combining the first RF QHTS and the second RF QHTS and the RF receive output signal provided as a result of combining the second RF QHRS and the second RF QHRS.

Referring now to FIGS. 2 and 2G, FIG. 2G illustrates one embodiment of the RF transmission output signal 16 and one embodiment of the RF receive output signal 30. To provide the RF transmission output signal 16, the second hybrid coupler 20 combines the first RF QHTS 56 (shown in FIG. 2E) and the second RF QHTS 58 (shown in FIG. 2F) within the passband 50 (shown in FIGS. 2E and 2F) into the RF transmission output signal 16 (procedure 1016). As shown in FIG. 2G, the RF transmission output signal 16 operates within the RF transmission band 38. Ideally, the RF transmission output signal 16 has the same power spectral density as the RF transmission input signal 26. However, in practice, the tunable RF duplexer 10 may not be lossless, and thus the power spectral density of the RF transmission output signal 16 may be somewhat smaller than the power spectral density of the RF transmission input signal 26.

As shown in FIG. 2G, the RF transmission output signal 16 has a signal bandwidth 72 within the RF transmission band 38. In this example, the signal bandwidth 72 is the same as the signal bandwidth 43 (shown in FIG. 2A) of the RF transmission input signal 26. Thus, the signal bandwidth 72 is between the frequencies $f_{TBW1}$ and $f_{TBW2}$. Furthermore, the RF transmission output signal 16 operates at the RF transmission frequency $f_T$, like the RF transmission input signal 26. However, this may not be exactly the case in all circumstances. For example, the signal bandwidth 72 may be slightly smaller, larger, or misaligned with the signal bandwidth 43 of the RF transmission input signal 26. There may also be a small frequency displacement between the RF transmission frequency of the RF transmission input signal 26 and the RF transmission frequency $f_T$ of the RF transmission output signal 16. The amount of error permissible for these parameters may depend on the particular application and/or spectrum requirements. Furthermore, additional circuitry may be provided in order to compensate for these errors.

Referring again to FIGS. 2 and 2G, FIG. 2G also illustrates one embodiment of the RF receive output signal 30. To provide the RF receive output signal 30, the second hybrid coupler 20 combines the first RF QHRS 60 (shown in FIG. 2E) and the second RF QHRS 62 (shown in FIG. 2F) within the stopband 52 (shown in FIGS. 2E and 2F) into the RF receive output signal 30 (procedure 1018). Ideally, the RF receive output signal 30 has the same spectral power density as the RF receive input signal 14 shown in FIG. 2A. However, the tunable RF duplexer 10 may not be lossless, and thus, the power spectral density of the RF receive output signal 30 may be smaller. As shown in FIG. 2G, the RF receive output signal 30 has a signal bandwidth 74. The signal bandwidth 74 may be the same as the signal bandwidth 40 (shown in FIG. 2A) of the RF receive input signal 14. Thus, in FIG. 2G, the signal bandwidth 74 of the RF receive output signal 30 is between the frequency $f_{RBW1}$ and $f_{RBW2}$. However, this may not be the case. For example, the signal bandwidth 74 may be smaller, larger, or misaligned with the signal bandwidth 40. Also, the RF receive output signal 30 shown in FIG. 2G operates at the RF receive frequency $f_R$, like the RF receive input signal 14. This may or may not be the case. For example, there may be a small displacement between the RF receive frequency $f_R$ of the RF receive output signal 30 and the RF receive frequency $f_R$ of the RF receive input signal 14. The amount of error that is permissible in these parameters may depend on a particular application and/or spectrum requirements.

Figure 3A:
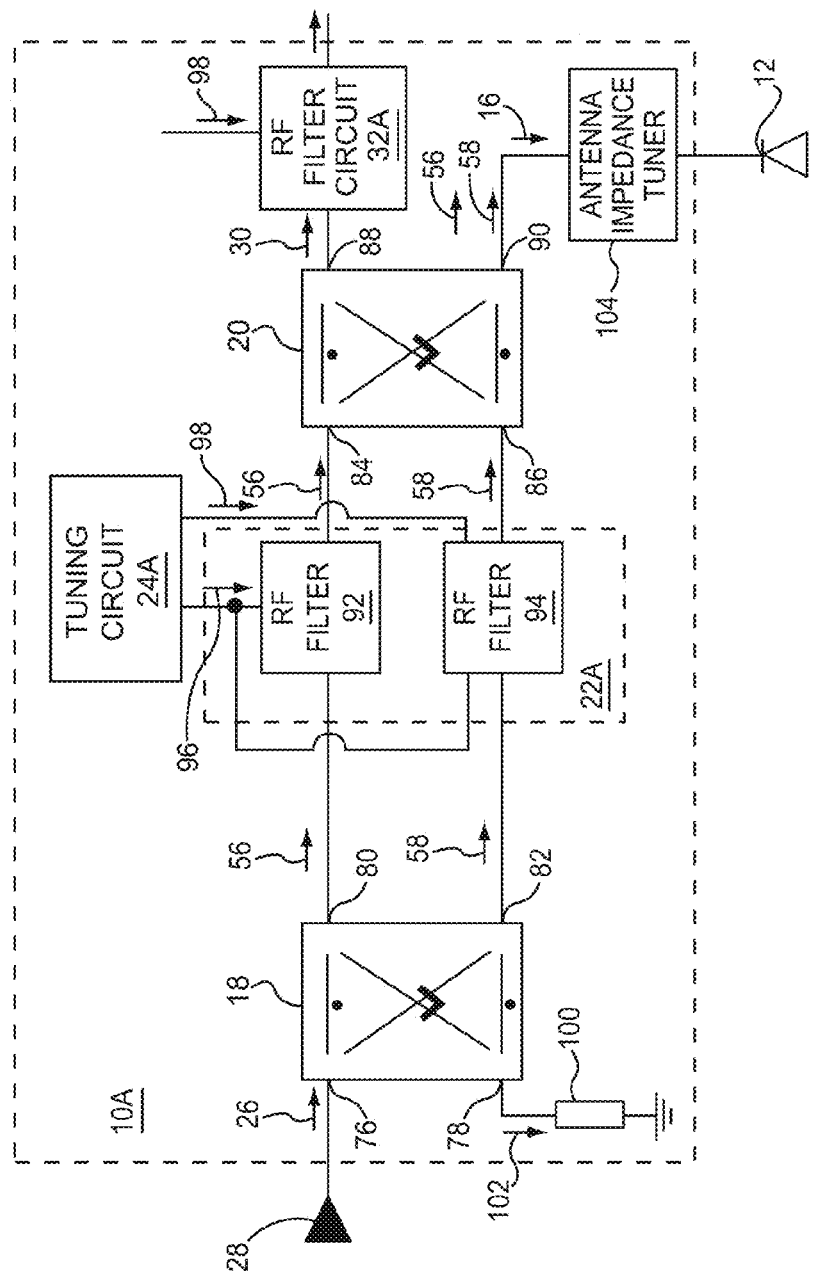
FIG. 3A illustrates one embodiment of an RF duplexer along with a transmission signal flow.

FIG. 3A illustrates an RF duplexer 10A along with a transmission signal flow of the tunable RF duplexer 10A. The tunable RF duplexer 10A includes the first hybrid coupler 18, the second hybrid coupler 20, an RF filter circuit 22A, and a tuning circuit 24A. As shown in FIG. 3A, the first hybrid coupler 18 has a first port 76, a second port 78, a third port 80, and a fourth port 82, while the second hybrid coupler 20 has a fifth port 84, a sixth port 86, a seventh port 88, and an eighth port 90.

The first hybrid coupler 18 is configured to receive the RF transmission input signal 26. In this particular embodiment, the first port 76 of the first hybrid coupler 18 is driven by the power amplifier 28 from the transmission chain. Accordingly, the first hybrid coupler 18 is configured to receive the RF transmission input signal 26 at the first port 76. The second port 78 of the first hybrid coupler 18 is isolated from the first port 76. This means that the first port 76 is substantially unresponsive to signals incident at the second port 78 and the second port 78 is substantially unresponsive to signals incident at the first port 76. As a result, the second port 78 is substantially unresponsive to the RF transmission input signal 26 incident at the first port 76.

The first hybrid coupler 18 is operable to split the RF transmission input signal 26 into the first RF QHTS 56 and the second RF QHTS 58. In this manner, the first RF QHTS 56 and the second RF QHTS 58 have approximately the same power ratio with respect to the RF transmission input signal 26, but have a quadrature phase difference of approximately 90 degrees or $\pi/2$ radians. In the embodiment shown in FIG. 3A, the first port 76 is phase-aligned with the third port 80, while the third port 80 has a quadrature phase shift with respect to the first port 76. Thus, the first RF QHTS 56 is approximately phase-aligned with the RF transmission input signal 26, but there is a quadrature phase difference between the RF transmission input signal 26 and the second RF QHTS 58.

Note that in alternative embodiments, this may or may not be the case. For example, there may be a phase shift between the first port 76 and the third port 80. The phase shift between the first port 76 and the fourth port 82 may then be equal to this phase shift plus 90 degrees or $\pi/2$ radians. Accordingly, so long as the phase difference between the first RF QHTS 56 and the second RF QHTS 58 is about 90 degrees or $\pi/2$ radians, phase alignment between the third port 80 and the first port 76, and between the fourth port 82 and the first port 76, can vary.

The first RF QHTS 56 is output at the third port 80 to the RF filter circuit 22A. Additionally, the second RF QHTS 58 is output at the fourth port 82 to the RF filter circuit 22A. In this embodiment, the RF filter circuit 22A has a first RF filter 92 (an embodiment of the RF filter 23A shown in FIG. 1) and a second RF filter 94 (an embodiment of the RF filter 23B shown in FIG. 1). The first RF filter 92 is coupled to the third port 80 so as to receive the first RF QHTS 56 from the first hybrid coupler 18. The second RF filter 94 is coupled to the fourth port 82 so as to receive the second RF QHTS 58 from the first hybrid coupler 18. The first RF filter 92 and the second RF filter 94 each have a frequency response. The frequency response of the RF filter circuit 22A is thus determined in accordance with the combined effect of the independent frequency responses provided by the RF filter 92 and the RF filter 94. However, in this embodiment, the first RF filter 92 and the second RF filter 94 are identical to one another. Furthermore, each is tuned in accordance with a transmission tuning control signal 96 from the tuning circuit 24A. As such, the overall frequency response of the RF filter circuit 22A is the same as the independent frequency responses provided by the first RF filter 92 or the second RF filter 94. Alternatively, in other embodiments, the first RF filter 92 and the second RF filter 94 may be different and/or may be tuned independently by the tuning circuit 24A. As such, the different independent frequency responses from the first RF filter 92 and the second RF filter 94 may combine to determine the overall frequency response of the RF filter circuit 22A.

Referring again to FIG. 3A, the tuning circuit 24A is configured to tune the frequency response of the RF filter circuit 22A so that the passband includes the RF transmission band. The tuning circuit 24A thus shifts the passband of the RF filter circuit 22A to include the RF transmission band. In this manner, the RF filter circuit 22A is operable to pass the first RF QHTS 56 and the second RF QHTS 58 to the second hybrid coupler 20. The manner of tuning the frequency response may depend on the topology of the RF filter circuit 22A. For example, the RF filter 92 and the RF filter 94 shown in FIG. 3A are each passive filters. Accordingly, one or more reactive impedance components (inductive, capacitive, or both) in each of the RF filters 92, 94 may have a variable reactive impedance level. By varying these variable reactive impedance levels, the poles and zeros of the individual frequency responses provided by each of the RF filters 92, 94 are adjusted. This thereby shifts the passband and/or the stopband of the RF filter circuit 22A.

As mentioned above, the tuning circuit 24A illustrated in FIG. 3A generates the transmission tuning control signal 96 and a receive tuning control signal 98. The variable reactive impedance components in both the RF filter 92 and the RF filter 94 are set in accordance to a signal level of the transmission tuning control signal 96. In this manner, the stopband is shifted to include the RF receive band. Similarly, reactive impedance levels of variable reactive components in the first RF filter 92 and the second RF filter 94 are set in accordance to a signal level of the receive tuning control signal 98. In this manner, the stopband is set to include the RF receive band. In alternative embodiments, the RF filter circuit 22A may include active RF filters, Surface Acoustic Wave (SAW) filters, or any other type of RF filter or combination of RF filters that are suitable to provide a desired frequency response. As such, the tuning circuit 24A may employ alternative types of tuning topologies that are different from the particular filtering topology being employed by the RF filter circuit 22A.

By placing the passband in the RF transmission band, the RF filter circuit 22A passes the first RF QHTS 56 and the second RF QHTS 58 to the second hybrid coupler 20. In this particular embodiment, the first RF filter 92 passes the first RF QHTS 56 to the second hybrid coupler 20, while the second RF filter 94 passes the second RF QHTS 58 to the second hybrid coupler 20. As mentioned above, the stopband (for example, the notch) is set in the RF receive band. As such, spurious emissions of the first RF QHTS 56 and the second RF QHTS 58 that are within the RF receive band are reflected back to the first hybrid coupler 18. An impedance load 100 is coupled to the second port 78 of the first hybrid coupler 18. The impedance load 100 may be a 50 Ohm load. Due to the phase-shifting provided by the first hybrid coupler 18, the spurious emissions in the RF receive band see a very high (theoretically infinite) impedance level at the first port 76, but only the impedance load 100 at the second port 78. Thus, the spurious emissions are aggregated to be an aggregated noise signal 102 at the second port 78. This aggregated noise signal 102 is dissipated by the impedance load 100.

Referring again to FIG. 3A, the second hybrid coupler 20 receives the first RF QHTS 56 from the RF filter 92 at the fifth port 84. The second RF QHTS 58 is received by the second hybrid coupler 20 from the RF filter 94 at the sixth port 86. As discussed above, the first RF QHTS 56 and the second RF QHTS 58 have a quadrature phase difference of about 90 degrees or $\pi/2$ radians. Thus, for example, if the first RF QHTS 56 has a phase of zero degrees, the second RF QHTS 58 would have a phase of approximately 90 degrees (or $\pi/2$ radians). From the fifth port 84 to the seventh port 88, the second hybrid coupler 20 provides no phase shift. Alternatively, the second hybrid coupler 20 may be configured to provide a phase shift from the fifth port 84 to the seventh port 88 of $\Delta$.

The second hybrid coupler 20 shown in FIG. 3A is configured to provide a quadrature phase shift from the sixth port 86 to the seventh port 88. In this example, the phase shift is 90 degrees (or $\pi/2$ radians), and thus the second QHTS 58 has a phase, as seen from the seventh port 88, of 180 degrees (note that the second QHTS 58 was received with a phase of 90 degrees in this example, and thus is seen with a phase of 180 degrees with another phase shift of 90 degrees). Alternatively, the phase shift from the sixth port 86 to the seventh port 88 may be $\Delta+90$ degrees (or $\pi/2$ radians). In any case, the phase difference between the first RF QHTS 56 and the second RF QHTS 58 as seen from the seventh port 88 is about 180 degrees (note that the first RF QHTS 56 was received with a phase of 0 degrees and thus is seen with a phase of 0 degrees at the seventh port 88). Accordingly, the quadrature phase shift at the seventh port 88 from the sixth port 86 results in destructive interference between the first RF QHTS 56 and the second RF QHTS 58 at the seventh port 88. As a result, the first RF QHTS 56 and the second RF QHTS 58 are substantially cancelled at the seventh port 88. In this manner, the seventh port 88 is substantially isolated from transmission signal flow.

The second hybrid coupler 20 is configured to output the RF transmission output signal 16 from the eighth port 90 in response to the first RF QHTS 56 being received from the RF filter circuit 22A at the sixth port 84 and the second RF QHTS 58 being received from the RF filter circuit 22A at the fifth port 86. In this particular embodiment, the second hybrid coupler 20 is configured to pass the second RF QHTS 58 from the sixth port 86 to the eighth port 90. The second hybrid coupler 20 provides no phase shift to the second RF QHTS 58 from the sixth port 86 to the eighth port 90. The second RF QHTS 58 is thus passed with a phase of 90 degrees to the eighth port 90. Alternatively, the second hybrid coupler 20 may provide a phase shift of $\Delta$ to the second RF QHTS 58 when passed from the sixth port 86 to the eighth port 90. The second hybrid coupler 20 is configured to pass the first RF QHTS 56 from the fifth port 84 to the eighth port 90. The second hybrid coupler 20 provides a quadrature phase shift to the first RF QHTS 56 at the eighth port 90. In this embodiment, the quadrature phase shift is 90 degrees or $\pi/2$ radians. Alternatively, if a phase shift of $\Delta$ was provided to the second RF QHTS 58 from the sixth port 86 to the eighth port 90, the quadrature phase shift would be $\Delta+90$ degrees (or $\pi/2$ radians).

Accordingly, the first RF QHTS 56 is provided substantially as a duplicate of the second RF QHTS 58 at the eighth port 90. This is a result of the quadrature phase shift provided to the first RF QHTS 56 when passed from the sixth port 84 to the eighth port 90 (now, at the eighth port 90, the first RF QHTS 56 is shifted to have a phase of 90 degrees, just like the second RF QHTS 58). Referring again to the example discussed previously, if the first RF QHTS 56 has a phase of zero at the fifth port 84, then the first RF QHTS 56 has a phase of 90 degrees at the eighth port 90. If the phase of the second RF QHTS 58 at the sixth port 86 is 90 degrees, then the phase of the second RF QHTS 58 is also 90 degrees at the eighth port 90. Accordingly, the first RF QHTS 56 is substantially a duplicate of the second RF QHTS 58 at the eighth port 90 because the first RF QHTS 56 and the second RF QHTS 58 become phase-aligned at the eighth port 90. As a result, the first RF QHTS 56 and the second RF QHTS 58 constructively interfere at the eighth port 90 to output the RF transmission output signal 16 from the eighth port 90. Note that since the first RF QHTS 56 and the second RF QHTS 58 substantially cancel at the seventh port 88 due to destructive interference, very little or no power is transferred from the first RF QHTS 56 and the second RF QHTS 58 to the seventh port 88. Instead most, if not all, of the power in the first RF QHTS 56 and the second RF QHTS 58 is transferred to the eighth port 90 and provided in the RF transmission output signal 16.

The antenna 12 is operably associated with the eighth port 90. In this manner, the antenna 12 can radiate the RF transmission output signal 16 to transmit data and information to external communication systems. As shown in FIG. 3A, an antenna impedance tuner 104 is coupled between the antenna 12 and the eighth port 90. The antenna impedance tuner 104 is tunable so as to reduce reflections from the antenna 12 to the eighth port 90. For example, an impedance of the antenna 12 may be tuned to the RF receive frequency and/or the RF receive band. Accordingly, since the RF transmission output signal 16 is in the RF transmission band, the impedance of the antenna 12 would result in a portion of the RF transmission output signal 16 being reflected back to the eighth port 90. This not only would degrade the RF transmission output signal 16, but would also degrade the isolation between the transmission signal flow and the seventh port 88. Thus, the antenna impedance tuner 104 provides impedance matching between the eighth port 90 and the antenna 12 to reduce reflections from the RF transmission output signal 16.

The first hybrid coupler 18 is thus configured to output the first RF QHTS 56 from the third port 80 and the second RF QHTS 58 from the fourth port 82 in response to the RF transmission input signal 26 being received at the first port 76. The RF filter circuit 22A, however, provides isolation to the first port 76 from the second hybrid coupler 20 and, as explained in further detail below, from the receive signal flow. Once the first RF QHTS 56 and the second RF QHTS 58 pass through and are filtered by the RF filter circuit 22A, the second hybrid coupler 20 is configured to output the RF transmission output signal 16 from the eighth port 90 in response to the first RF QHTS 56 being received from the RF filter circuit 22A at the fifth port 84 and the second RF QHTS 58 being received from the RF filter circuit 22A at the sixth port 86.

Figure 3B:
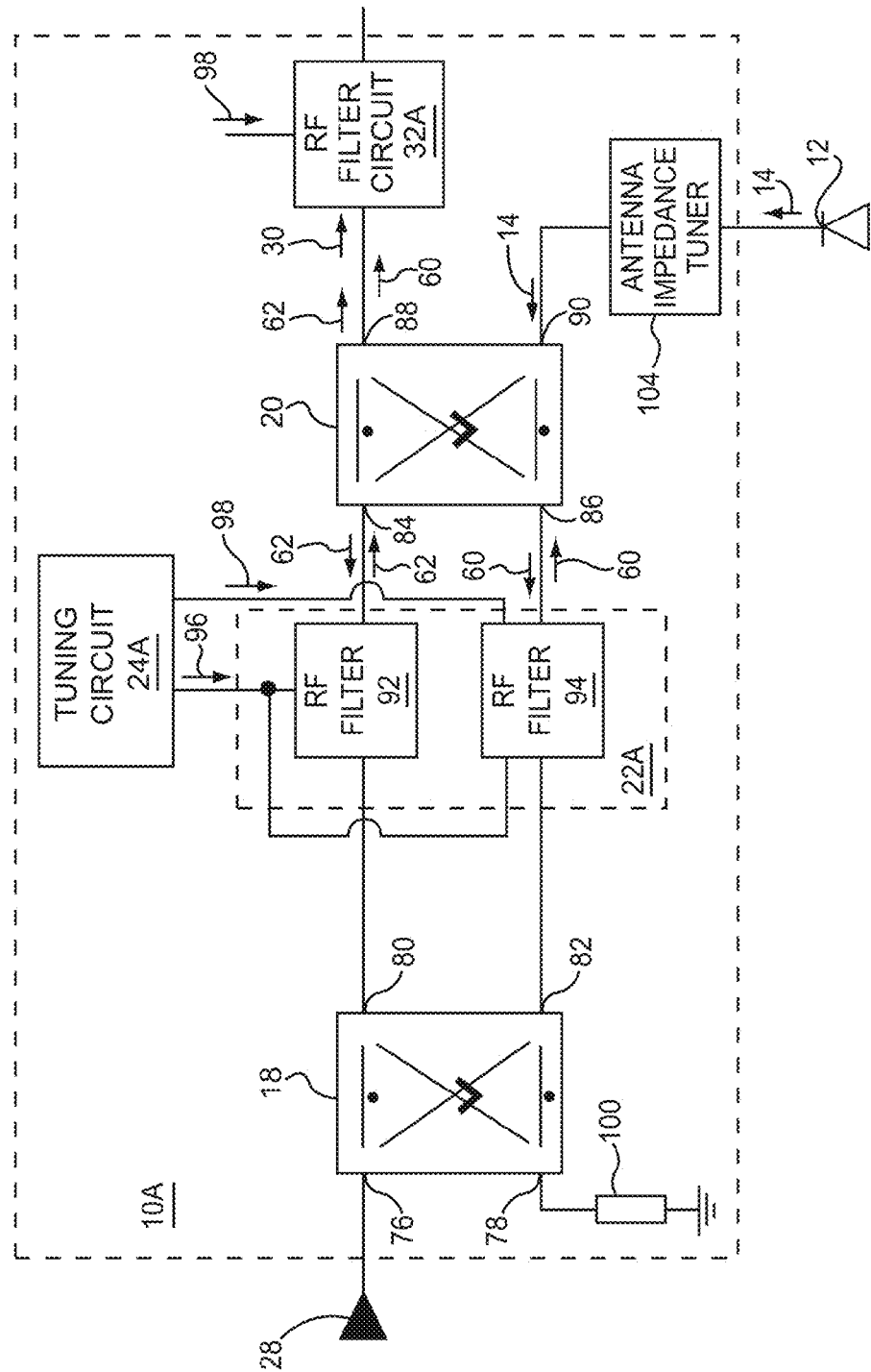
FIG. 3B illustrates the same embodiment of the tunable RF duplexer along with a receive signal flow.

FIG. 3B illustrates the tunable RF duplexer 10A along with the receive signal flow. The antenna 12 intercepts the RF receive input signal 14 as electromagnetic waves in free space. These electromagnetic waves result in excitations within the antenna 12, thereby converting the electromagnetic waves into the RF receive input signal 14. The second hybrid coupler 20 is configured to receive the RF receive input signal 14 at the eighth port 90. The RF receive input signal 14 operates in the RF receive band within the same RF communication band as the RF transmission input signal 26 (shown in FIG. 3A). The second hybrid coupler 20 is operable to split the RF receive input signal 14 into the first RF QHRS 60 and the second RF QHRS 62. Since the first RF QHRS 60 and the second RF QHRS 62 are quadrature hybrids, the first RF QHRS 60 and the second RF QHRS 62 are approximately equal in power, but have a quadrature phase difference of 90 degrees or $\pi/2$ radians. The second hybrid coupler 20 outputs the first RF QHRS 60 from the sixth port 86 and outputs the second RF QHRS 62 from the fifth port 84 in response to receiving the RF receive input signal 14 at the eighth port 90.

In the embodiment illustrated in FIG. 3B, the first RF QHRS 60 is phase-aligned with the RF receive input signal 14, while the second RF QHRS 62 has a phase difference of about 90 degrees with respect to the RF receive input signal 14. It should be noted that this may or may not be the case. For example, in alternative embodiments, a phase shift of Δ may be provided between the eighth port 90 and the sixth port 86, and thus, a phase shift of Δ+90 degrees (or $\pi/2$ radians) would be provided between the eighth port 90 and the fifth port 84.

The RF filter circuit 22A is operable to reflect the first RF QHRS 60 and the second RF QHRS 62. As discussed above, the frequency response of the RF filter circuit 22A defines the stopband and the RF filter circuit 22A is tunable so as to shift the stopband. For example, the stopband may be a notch that is shiftable. The tuning circuit 24A is configured to tune the frequency response of the RF filter circuit 22A so that the signal bandwidth of the first RF QHRS 60 and the signal bandwidth of the second RF QHRS 62 are each within the stopband. For instance, the tuning circuit 24A may be configured to place the notch within the RF receive band so that the notch is centered at the RF receive signal frequency. In this embodiment, the tuning circuit 24A generates the receive tuning control signal 98. Variable reactive impedance components in both the first RF filter 92 and the second RF filter 94 are responsive to the signal level of the receive tuning control signal 98 so as to adjust the variable impedance levels based on the signal level of the receive tuning control signal 98. As a result, the notch defined by the individual frequency response of the first RF filter 92 is shifted to include the signal bandwidth of the second RF QHRS 62. Also, the notch defined by the individual frequency response of the second RF filter 94 is shifted to include the signal bandwidth of the first RF QHRS 60. In other words, the notches defined by the individual frequency responses of the first RF filter 92 and the second RF filter 94 are placed in the RF receive band.

Since the tuning circuit 24A has tuned the frequency response of the RF filter circuit 22A so that the stopband includes the RF receive signal band, the RF filter circuit 22A blocks the first RF QHRS 60 and the second RF QHRS 62. Accordingly, the first port 76 is substantially isolated from the receive signal flow. The RF filter circuit 22A then reflects the first RF QHRS 60 and the second RF QHRS 62 back to the second hybrid coupler 20. In the embodiment illustrated in FIG. 3A, the first RF filter 92 reflects the second RF QHRS 62 back to the second hybrid coupler 20 at the fifth port 84. The second RF filter 94 reflects the first RF QHRS 60 back to the second hybrid coupler 20 at the sixth port 86.

The second hybrid coupler 20 is configured to combine the first RF QHRS 60 and the second RF QHRS 62 into the RF receive output signal 30. To combine the first RF QHRS 60 and the second RF QHRS 62 into the RF receive output signal 30, the second hybrid coupler 20 is configured to pass the second RF QHRS 62 from the fifth port 84 to the seventh port 88. Additionally, the second hybrid coupler is configured to pass the first RF QHRS 60 from the sixth port 86 to the seventh port 88. However, the second hybrid coupler 20 provides a quadrature phase shift to the first RF QHRS 60 at the seventh port 88. Thus, the first RF QHRS 60 is provided substantially as a duplicate of the second RF QHRS 62 at the seventh port 88. For example, if the phase of the second RF QHRS 62 is 90 degrees at the fifth port 84, the second RF QHRS 62 has a phase of 90 degrees at the seventh port 88. As such, the phase of the first RF QHRS 60 at the sixth port 86 is approximately zero degrees. However, due to the quadrature phase shift between the sixth port 86 and the seventh port 88, the first RF QHRS 60 has a phase of about 90 degrees at the seventh port 88. Accordingly, the first RF QHRS 60 and the second RF QHRS 62 constructively interfere at the seventh port 88 to output the RF receive output signal 30 from the seventh port 88.

Also, note that the second hybrid coupler 20 is configured such that the quadrature phase shift at the eighth port 90 results in destructive interference between the first RF QHRS 60 and the second RF QHRS 62. Referring again to the previous example provided, at the eighth port 90, the first RF QHRS 60 appears to have a phase of zero degrees, but the second RF QHRS 62 appears to have a phase of 180 degrees. As a result, the first RF QHRS 60 and the second RF QHRS 62 are substantially cancelled at the eighth port 90. Consequently, most, if not all, of the power of the first RF QHRS 60 and the second RF QHRS 62 is transferred to the seventh port 88 and provided in the RF receive output signal 30. The second hybrid coupler 20 is thus configured to output the RF receive output signal 30 from the seventh port 88 in response to the first RF QHRS 60 being reflected back by the RF filter circuit 22A to the sixth port 86 and the second RF QHRS 62 being reflected back by the RF filter circuit 22A to the fifth port 84. The configuration of the second hybrid coupler 20 and the RF filter circuit 22A thus provides substantial isolation between the seventh port 88 and the eighth port 90.

As shown in FIG. 3B, a second RF filter circuit 32A is coupled to the seventh port 88. Thus, the second RF filter circuit 32 is configured to receive the RF receive output signal 30 from the second hybrid coupler 20. The second RF filter circuit 32A has a frequency response that defines a passband. The second RF filter circuit 32A is tunable to shift the passband. In this embodiment, the tuning circuit 24A is configured to tune the second RF filter circuit 32A so that the signal bandwidth of the RF receive output signal 30 is within the passband of the second RF filter circuit 32A. The passband of the second RF filter circuit 32A is provided to filter out spurious emissions and/or external noise emissions in the RF receive output signal 30 that are outside the RF receive band. After being filtered by the second RF filter circuit 32A, the RF receive output signal 30 may be provided to a downstream receiver chain for further processing.

As shown in FIGS. 3A and 3B, the eighth port 90 of the second hybrid coupler 20 is configured to simultaneously receive the RF receive input signal 14 and output the RF transmission output signal 16. Accordingly, the RF transmission output signal 16 is output from the eighth port 90 while the RF receive input signal 14 is being received at the eighth port 90. The tunable RF duplexer 10A can provide this functionality because the seventh port 88 is substantially isolated from the first port 76. Accordingly, the transmission signal flow is substantially isolated from the receive signal flow.

Figure 4:
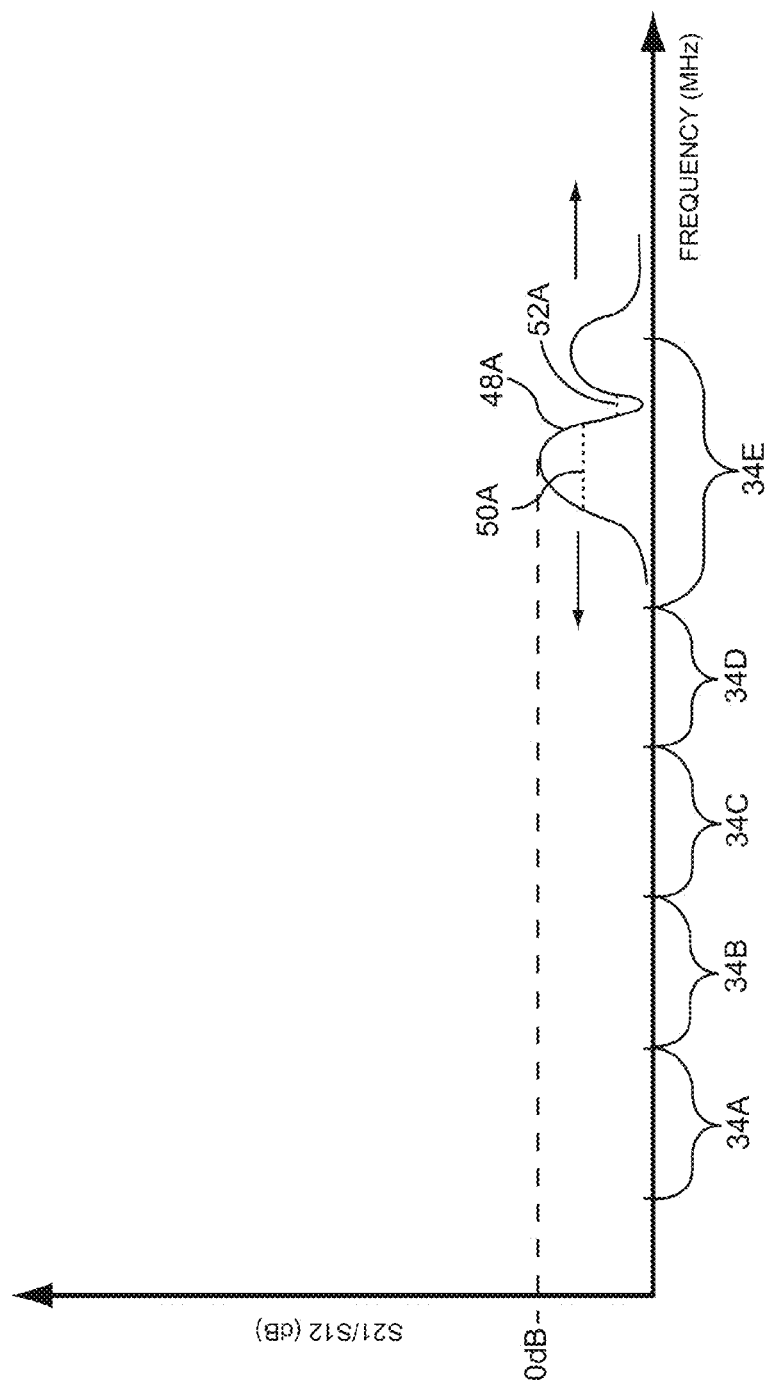
FIG. 4 illustrates one embodiment of a frequency response of an RF filter circuit in the tunable RF duplexer shown in FIGS. 3A and 3B wherein the frequency response defines a passband and a stopband.

FIG. 4 illustrates one embodiment of the frequency response 48A provided by the RF filter circuit 22A shown in FIGS. 3A and 3B. The frequency response 48A defines the passband 50A and the stopband 52A. The RF filter circuit 22A described in FIGS. 3A and 3B is tunable so that the RF communication band (referred to generically as element 34 and specifically as elements 34A-34E) can be switched to be any one of a plurality of different RF communication bands 34A-34E. The different RF communication bands 34A-34E may each define different RF transmission band(s) and different RF receive band(s) within each of the RF communication bands 34A-34E. Accordingly, the RF transmission input signal 26 (shown in FIG. 3A) and the RF receive input signal 14 (shown in FIG. 3B) may be in the respective RF transmission band and RF receive band of any of the different RF communication bands 34A-34E. Accordingly, the first RF QHTS 56, the second RF QHTS 58, and the RF transmission output signal 16 would also operate within the RF transmission band of the RF transmission input signal 26. Similarly, the first RF QHRS 60, the second RF QHRS 62, and the RF receive output signal 30 would operate in the respective RF receive band of the RF receive input signal 14.

When the RF communication band 34 is switched to be a different one of the plurality of RF communication bands 34A-34E, the tuning circuit 24A is operable to tune the frequency response 48A to the particular RF communication band 34A-34E. Since the RF communication band 34 has been switched, the first RF QHTS 56 and the second RF QHTS 58 are provided in the new RF communication band 34A-34E. In particular, the first RF QHTS 56 and the second RF QHTS 58 operate within the RF transmission band of the new RF communication band 34A-34E. Also, since the RF communication band 34 has been switched to the new RF communication band 34A-34E, the first RF QHRS 60 and the second RF QHRS 62 are provided within the new RF communication band 34A-34E. In particular, the first RF QHRS 60 and the second RF QHRS 62 operate within the RF receive band of the new RF communication band 34A-34E. The tuning circuit 24A tunes the passband 50A so as to pass the first RF QHTS 56 and the second RF QHTS 58 in response to the second RF communication band 34 being switched to the new RF communication band 34A-34E. More particularly, the passband 50A is provided so as to include the RF transmission band of the particular RF communication band 34A-34E. Similarly, the tuning circuit 24A shifts the stopband 52A to reflect the first RF QHRS 60 and the second RF QHRS 62 in response to the RF communication band 34 being switched to the new RF communication band 34A-34E. More particularly, the stopband 52A is shifted to include the RF receive band of the particular RF communication band 34A-34E.

Figure 5:
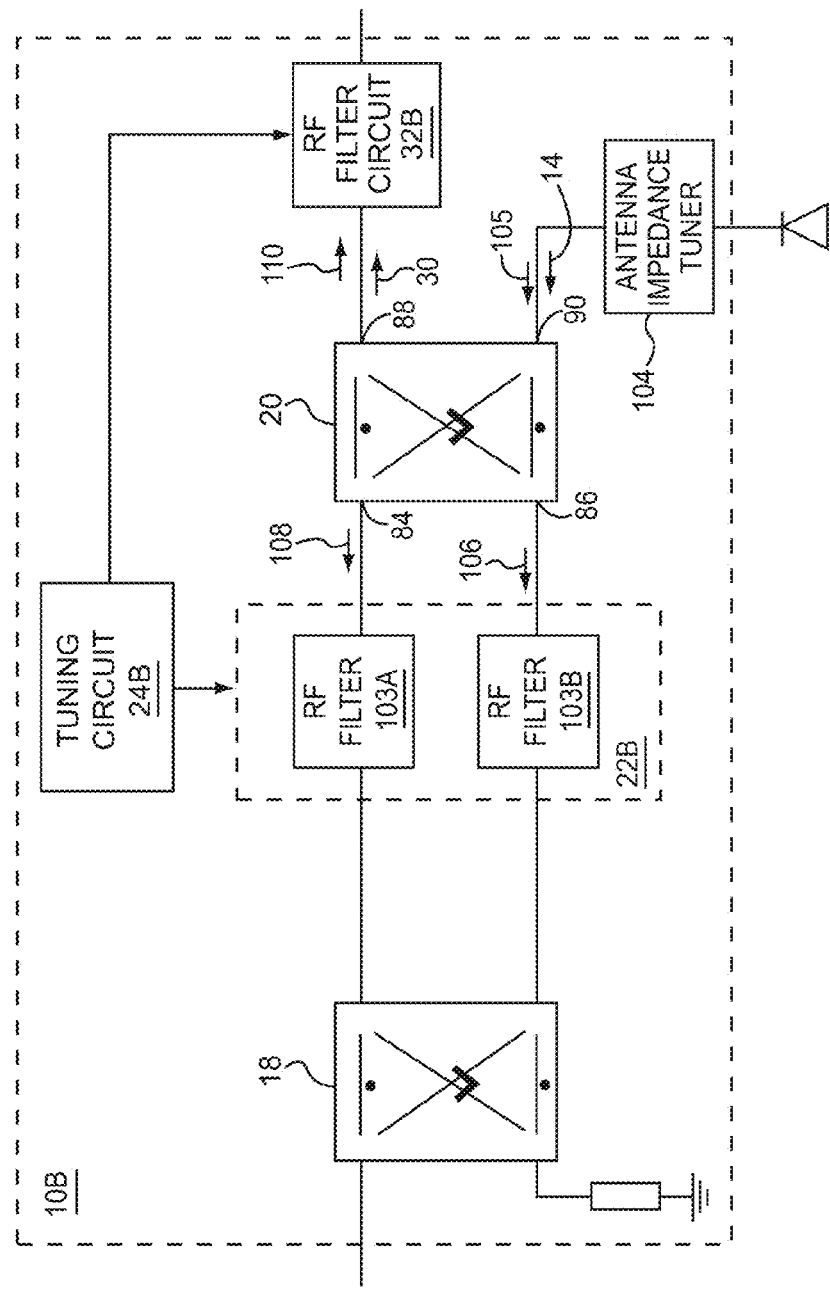
FIG. 5 illustrates another embodiment of an RF duplexer, wherein the tunable RF duplexer is designed for dual carrier aggregation.

FIG. 5 illustrates another embodiment of a tunable RF duplexer 10B. The tunable RF duplexer 10B is similar to the tunable RF duplexer 10A. The tunable RF duplexer 10B has an RF filter circuit 22B, a tuning circuit 24B, and another RF filter circuit 32B. The RF filter circuit 22B has a first RF filter 103A and a second RF filter 103B. Like the first RF filter 92 shown in FIG. 3A, the first RF filter 103A has an individual frequency response that defines a passband and a stopband. However, the first RF filter 103A also defines an additional stopband, such as an additional notch. Furthermore, like the second RF filter 94 illustrated in FIG. 3A, the second RF filter 103B defines a passband and a stopband. However, the second RF filter 94 defines an additional stopband. Similar to the RF filters 92, 94 of the RF filter circuit 22A shown in FIGS. 3A and 3B, the first RF filter 103A and the second RF filter 103B are identical. Given the individual frequency responses of the first RF filter 103A and the second RF filter 103B, the RF filter circuit 22B has a frequency response that defines a passband, a stopband, and an additional stopband. The stopbands may be provided as notches.

The second hybrid coupler 20 shown in FIG. 5 is configured to receive a second RF receive input signal 105 at the eighth port 90. The second RF receive input signal 105 operates in a second receive band within another RF communication band that is different from the RF communication band of the RF receive input signal 14. The second hybrid coupler 20 is configured to split the second RF receive input signal 105 into a third RF QHRS 106 and a fourth RF QHRS 108. The RF filter circuit 22B is tunable so as to tune the passband, the stopband, and the additional stopband.

The tuning circuit 22B is configured to tune the frequency response so as to shift the passband to the RF transmission band, and so as to shift the stopband to the RF receive band, just like the tuning circuit 24A described above in FIGS. 3A and 3B. However, the tuning circuit 24B in FIG. 5 is further configured to tune the frequency response so as to shift the additional stopband in the second RF receive band. In this manner, the third RF QHRS 106 and the fourth RF QHRS 108 are reflected back to the second hybrid coupler 20. In this embodiment, the third RF QHRS 106 is output at the sixth port 86 and the fourth RF QHRS 108 is output at the fifth port 84. The second RF filter 103B reflects the third RF QHRS 106 back to the sixth port 86, while the first RF filter 103A reflects the fourth RF QHRS 108 to the fifth port 84. The second hybrid coupler 20 is thus configured to combine the third RF QHRS 106 and the fourth RF QHRS 108 into a second RF receive output signal 110 at the seventh port 88. The second RF receive output signal 110 thus operates within the second RF receive band. The second RF filter circuit 32B may have a single, wide passband or multiple passbands in order to filter both the RF receive output signal 30 and the second RF receive output signal 110. The tuning circuit 22B tunes the second RF filter circuit 32B.

Figure 6:
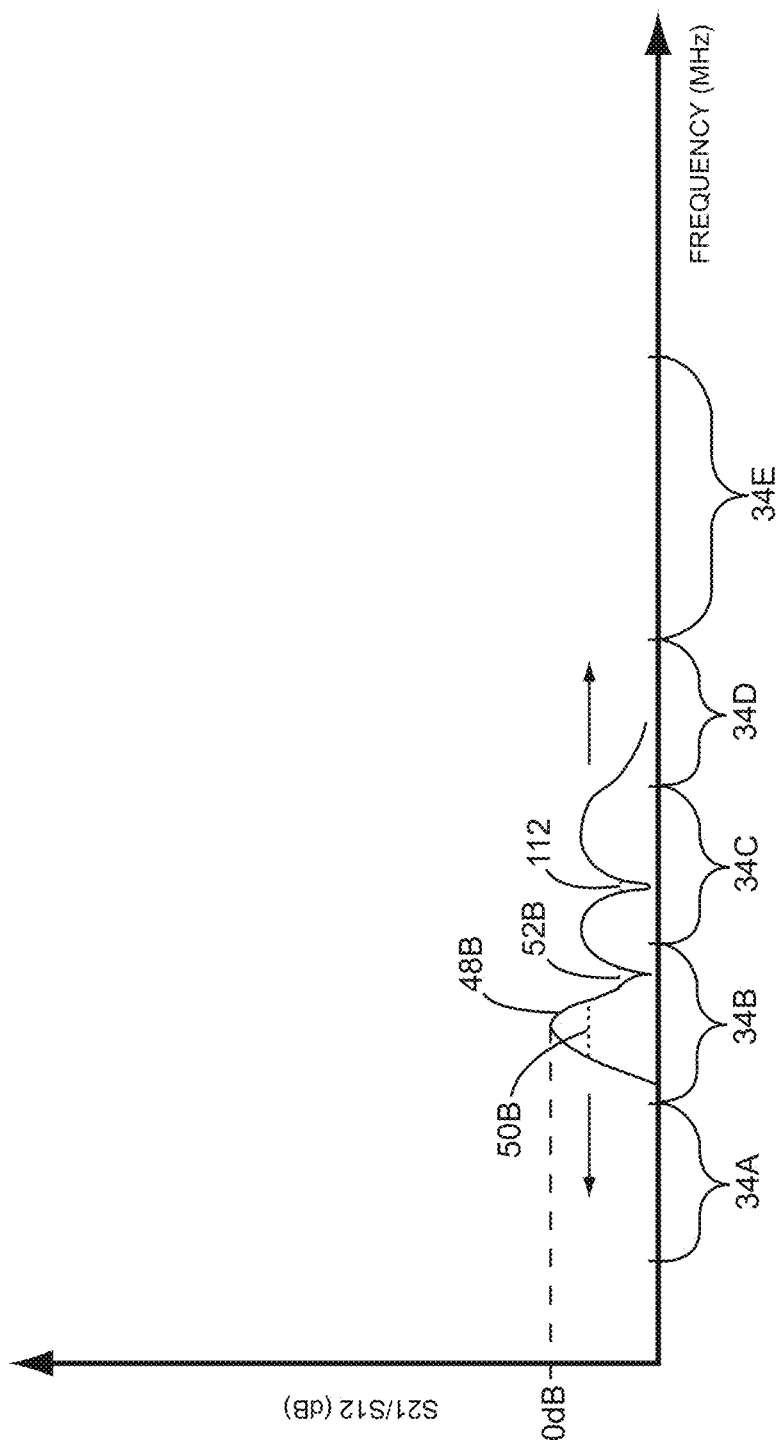
FIG. 6 illustrates one embodiment of a frequency response of an RF filter circuit provided by the tunable RF duplexer shown in FIG. 5 having a frequency response defining a passband, a stopband, and an additional stopband in order to provide dual carrier aggregation.

FIG. 6 illustrates an embodiment of the frequency response 48B provided by the RF filter circuit 22B. As shown in FIG. 6, the frequency response 48B has the passband 50B and the stopband 52B, like the frequency response 48A shown in FIG. 4. The RF filter circuit 22B is tunable so as to shift the passband 50B and the stopband 52B into any one of the RF communication bands 38A-38E. Additionally, since the frequency response 48B further defines the additional stopband 112, the additional stopband 112 can be provided in the RF receive band of a separate one of the RF communication bands 38A-38E. As such, the tunable RF duplexer 10B shown in FIG. 5 is operable to provide dual receive carrier aggregation.

Figure 7:
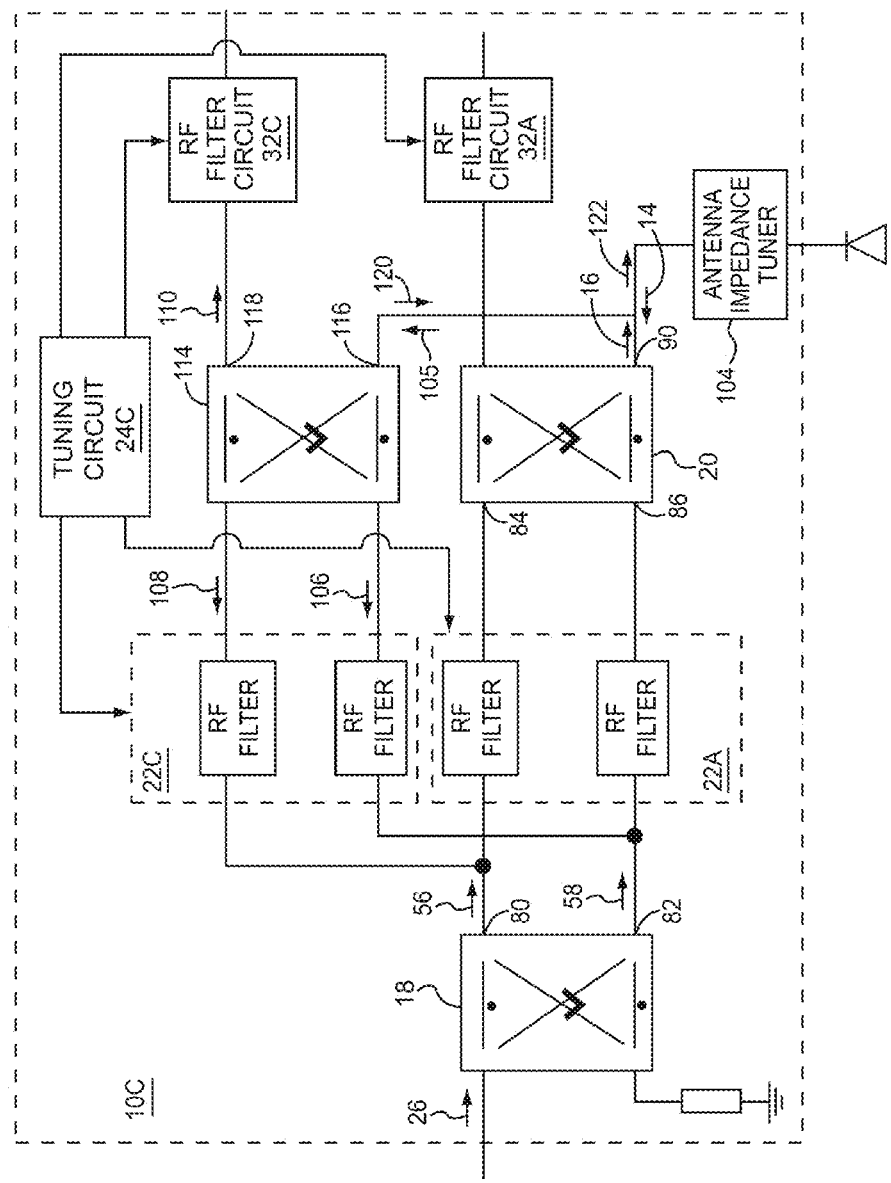
FIG. 7 illustrates yet another embodiment of an RF duplexer designed for dual carrier aggregation, but including an additional RF filter circuit and a third hybrid coupler.

FIG. 7 illustrates an embodiment of a tunable RF duplexer 10C. Like the tunable RF duplexer 10B shown in FIG. 5, the tunable RF duplexer 10C is also configured for dual receive carrier aggregation. The tunable RF duplexer 10C also includes the RF filter circuit 22A and the second RF filter circuit 32A coupled to the second hybrid coupler 20 and described above in the description of FIGS. 3A and 3B. However, the tunable RF duplexer 10C includes a third RF filter circuit 22C, a third hybrid coupler 114, and a fourth RF filter circuit 32C. The third RF filter circuit 22C has a frequency response that defines a second passband and a second stopband and is tunable to shift the second passband and the second stopband. A tuning circuit 24C tunes the frequency response of the third RF filter circuit 22C so that the second passband is provided in the RF transmission band, just like the passband of the RF filter circuit 22A. The tuning circuit 24C is also configured to tune the first stopband of the RF filter circuit 22A in the RF receive band, as described above with respect to FIG. 3A and FIG. 3B. However, the tuning circuit 24C tunes the frequency response of the third RF filter circuit 22C so that the second stopband is provided in the second receive band of the second RF receive input signal 105. As such, the second hybrid coupler 20 receives the RF receive input signal 14 at the eighth port 90.

Unlike the hybrid couplers in the tunable RF duplexer 10B shown in FIG. 5, the third hybrid coupler 114 is configured to receive the second RF receive input signal 105 at a ninth port 116 of the third hybrid coupler 114. The third hybrid coupler 114 is configured to split the second RF receive input signal 105 into the third RF QHRS 106 and the fourth RF QHRS 108, whereby both operate in the second RF receive band. Since the second stopband (for example, a second notch) is in the second RF receive band of the second RF receive input signal 105, the third RF filter circuit 22C reflects the third RF QHRS 106 and the fourth RF QHRS 108 back to the third hybrid coupler 114. The third hybrid coupler 114 is configured to combine the third RF QHRS 106 and the fourth RF QHRS 108 into the second RF receive output signal 110 at a tenth port 118.

While the tuning circuit 24C is configured to tune the frequency response of the third RF filter circuit 22C so that the second stopband is shifted in the second RF receive band, the tuning circuit 24C is configured to tune the frequency response of the third RF filter circuit 22C so that the second passband is shifted in the RF transmission band, just like the passband of the RF filter circuit 22A. As shown in FIG. 7, the third RF filter circuit 22C is also coupled to receive the first RF QHTS 56 and the second RF QHTS 58 from the first hybrid coupler 18.

As with the embodiment shown in FIGS. 3A and 3B, the first hybrid coupler 18 outputs the first RF QHTS 56 from the third port 80 at a half-power spectral density. The first hybrid coupler 18 outputs the second RF QHTS 58 from the fourth port 82, also at a half-power spectral density. However, the third RF filter circuit 22C and the RF filter circuit 22A are coupled so that the RF filter circuit 22A receives both the first RF QHTS 56 and the second RF QHTS 58 at a quarter-power spectral density. Thus, the tunable RF duplexer 10C outputs the RF transmission output signal 16 from the eighth port 90 with about half of the power of the RF transmission output signal 16 at the port 90 of the tunable RF duplexer 10A shown in FIGS. 3A and 3B.

Since the third RF filter circuit 22C is coupled to the RF filter circuit 22A, and since the tuning circuit 24C is configured to shift the second passband so that the third RF filter circuit 22C passes the first RF QHTS 56 and the second RF QHTS 58, the first RF QHTS 56 and the second RF QHTS 58 are both received by the third RF filter circuit 22C at a quarter-power spectral density. The first RF QHTS 58 and the second RF QHTS 58 are passed at the quarter-power spectral density to the third hybrid coupler 114. The third hybrid coupler 114 is configured to combine the first RF QHTS 56 and the second RF QHTS 58 (each at the quarter-power spectral density) into a second RF transmission output signal 120 at the ninth port 116 of the third hybrid coupler 114. As shown in FIG. 7, the ninth port 116 of the third hybrid coupler 114 and the eighth port 90 of the second hybrid coupler 20 are connected to one another. In this manner, the RF transmission output signal 16 and the second RF transmission output signal 120 are combined into an aggregated RF transmission output signal 122.

The fourth RF filter circuit 32C has a frequency response with another passband. The frequency response of the fourth RF filter circuit 32C is tunable. In this embodiment, the tuning circuit 24C tunes the frequency response so that the second passband is shifted into the second RF receive band. In this manner, the fourth RF filter circuit 32C can filter out-of-band spurious emissions and out-of-band external noise emissions from the second RF receive output signal 110. The second RF receive output signal 110 may then be sent to downstream circuitry in a receiver chain.

Figure 8:
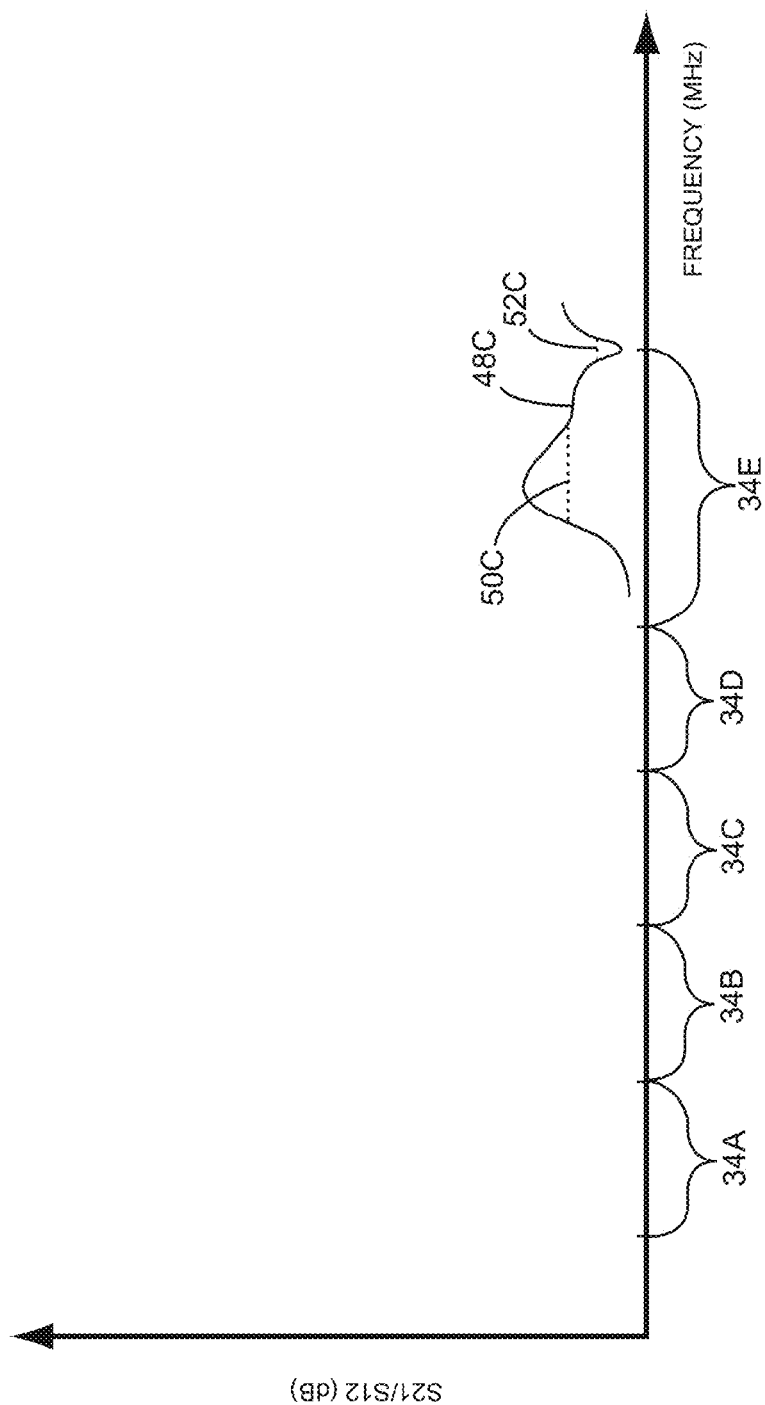
FIG. 8 illustrates an embodiment of the frequency response of the additional RF filter circuit shown in FIG. 7.

FIG. 8 illustrates one embodiment of the frequency response 48C provided by the third RF filter circuit 22C shown in FIG. 7. The frequency response 48C defines the second passband 50C and the second stopband 52C. As discussed above, the frequency response 48C may be tuned by the tuning circuit 24C. The second passband 50C is provided in the RF transmission band of the RF transmission input signal 26, just like the passband 50A (shown in FIG. 4). Accordingly, as the RF communication band 34 of the RF transmission input signal 26 is switched between the different RF communication bands 34A-34E, the tuning circuit 24C tunes the frequency response 48C so that the second passband 50C is placed in the RF transmission band of the appropriate RF communication band 34, just like the passband 50A shown in FIG. 4. However, the second stopband 52C is in the RF receive band within another RF communication band 34, in particular the RF communication band 34 of the second RF receive input signal 105. The tuning circuit 24C is configured to tune the frequency response 48C so that the second stopband 52C is placed within the RF receive band of this other RF communication band 34. In this manner, the tunable RF duplexer 10C shown in FIG. 7 can provide dual receive carrier aggregation.

Figure 9:
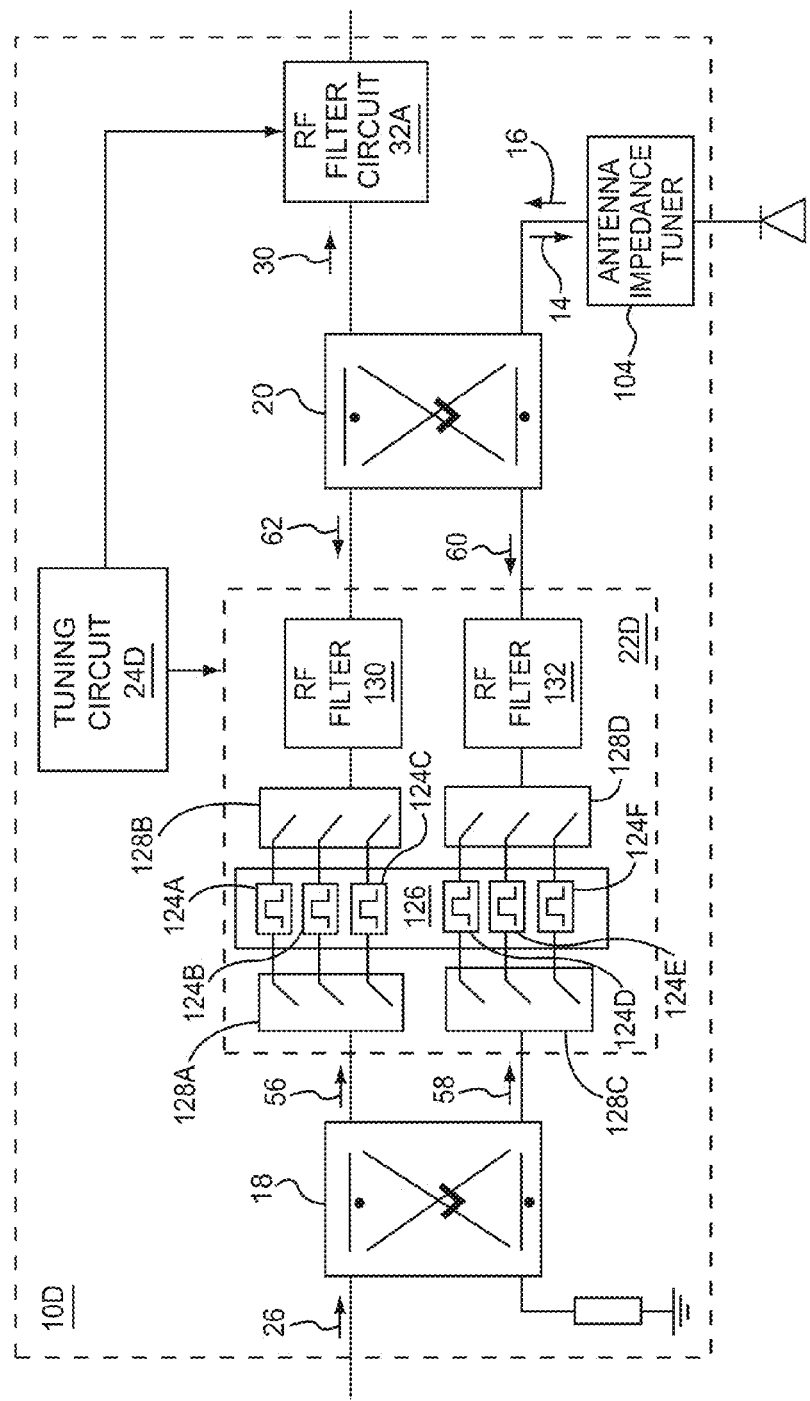
FIG. 9 illustrates still another embodiment of an RF duplexer having an RF filter circuit with a set of Surface Acoustic Wave (SAW) filters to provide the RF filter circuit with a passband having a higher quality (Q) factor.

FIG. 9 illustrates an embodiment of an RF duplexer 10D. Like the previously discussed embodiments, the tunable RF duplexer 10D includes an RF filter circuit 22D operable to pass the first RF QHTS 56 and the second RF QHTS 58 to the second hybrid coupler 20 and to reflect the first RF QHRS 60 and the second RF QHRS 62 back to the second hybrid coupler 20. However, the RF filter circuit 22D has a plurality of SAW filters (referred to generically as element 124, and specifically as elements 124A-124F). The SAW filters 124 are formed on a piezo-electric substrate 126. These SAW filters 124 are selectable by a set of single-pole triple-throw switches (referred to generically as element 128, and specifically as elements 128A-128D). In addition, the RF filter circuit 22D has an RF filter 130 and an RF filter 132. The RF filter 130 and the RF filter 132 are passive filters, and thus include passive reactive components. In particular, both the RF filter 130 and the RF filter 132 include tunable capacitor components such as tuning cap elements. The single-pole triple-throw switches 128 and the RF filters 130, 132 may be formed on a Silicon-on-insulator-type semiconductor substrate.

The RF filter circuit 22D has a frequency response that defines a passband and a stopband. By using the SAW filters 124, the Q factor of the passband may be significantly improved. The RF filter circuit 22D shown in FIG. 9 allows for the RF communication band to be switched into three different communication bands. The tuning circuit 24D is configured to operate the single-pole triple-throw switches 128 and vary the variable reactive impedance levels of variable reactive components in the RF filter 130 and the RF filter 132 so as to select the appropriate RF communication band. For example, when a first RF communication band is selected, the tuning circuit 24D activates the SAW filter 124A and the SAW filter 124D while setting the variable impedance levels of the variable reactive components in the RF filter 130 and the RF filter 132. When the second RF communication band is selected, the tuning circuit 24D activates the SAW filter 124B and the SAW filter 124E, and in addition, sets the variable impedance levels of the variable reactive components of the RF filter 130 and the RF filter 132. When the third RF communication band is selected, the tuning circuit 24D activates the SAW filter 124C and the SAW filter 124F. In addition, the tuning circuit 24D appropriately sets the variable impedance levels of the variable reactive components of the RF filter 130 and the RF filter 132.

Figure 10:
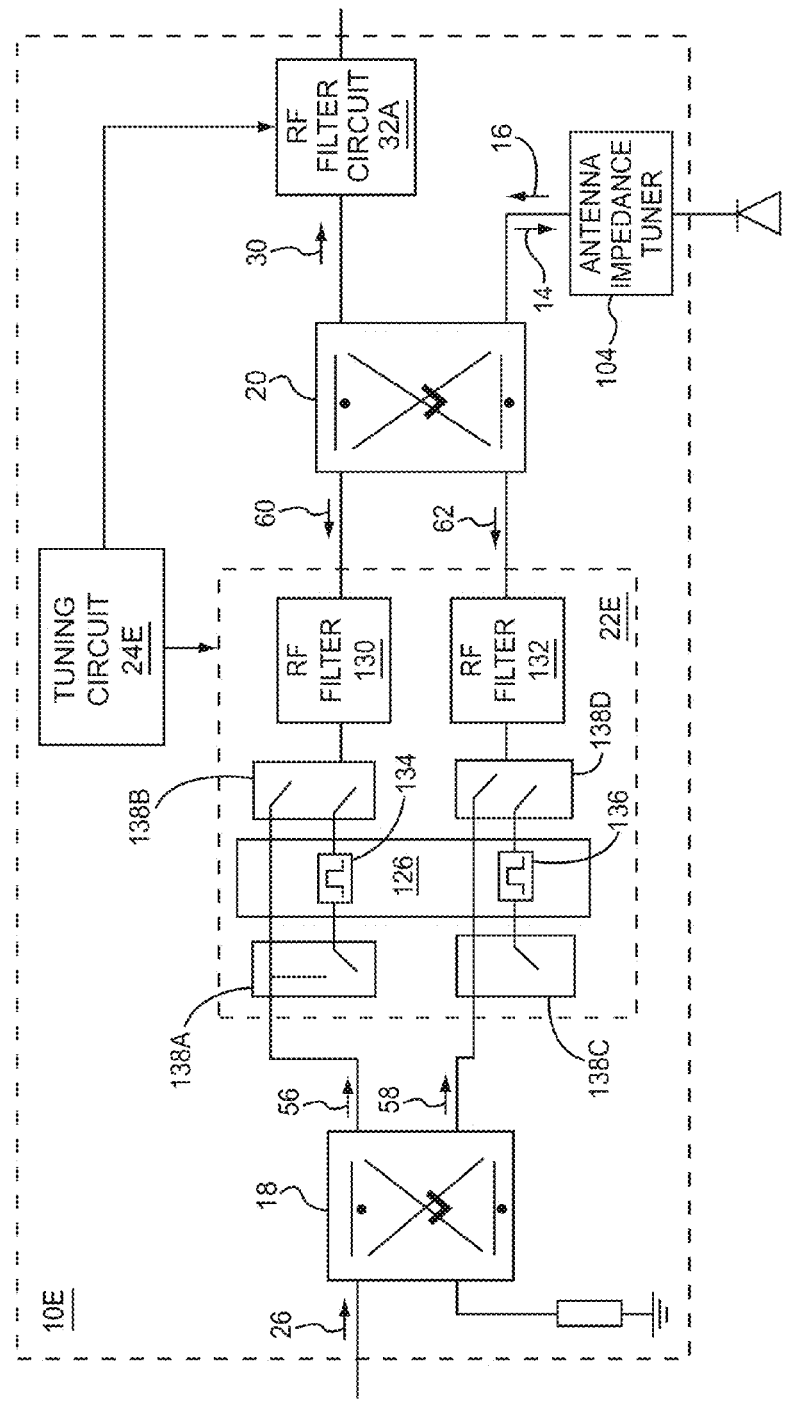
FIG. 10 illustrates still another embodiment of an RF duplexer having an RF filter circuit with a set of SAW filters to provide the RF filter circuit with a passband having a higher Q factor for a specific RF communication band.

FIG. 10 illustrates an embodiment of an RF duplexer 10E. Like the previously discussed embodiments, the tunable RF duplexer 10E has an RF filter circuit 22E operable to pass the first RF QHTS 56 and the second RF QHTS 58 to the second hybrid coupler 20, and to reflect the first RF QHRS 60 and the second RF QHRS 62 back to the second hybrid coupler 20. The RF filter circuit 22E includes the RF filter 130 and the RF filter 132 described above with respect to FIG. 9. However, in this embodiment, the RF filter circuit 22E only includes a pair of SAW filters 134, 136 formed on the piezo-electric substrate 126. Also, the RF filter circuit 22E includes single-pole double-throw switches (referred to generically as element 138, and specifically as elements 138A-138D) instead of the single-pole triple-throw switches 128.

The RF filter circuit 22E has a frequency response that defines a passband and a stopband. The RF filter circuit 22E is tunable between four different RF communication bands. The tuning circuit 24E is configured to tune the frequency response of the RF filter circuit 22E in order to shift the passband and the stopband into an appropriate one of the four RF communication bands. To select among the first three RF communication bands, the tuning circuit 24E simply sets the variable reactive impedance levels of the RF filter 130 and the RF filter 132. The tuning circuit 24E also operates the single-pole double-throw switches 138 such that the SAW filters 134, 136 are bypassed. However, the fourth RF communication band may have higher, more stringent duplex offset frequency separation requirements. Accordingly, when the fourth RF communication band is selected, the tuning circuit 24E may operate the single-pole double-throw switches 138 to bypass the RF filters 130 and 132 and select the pair of SAW filters 134 and 136.

Figure 11:
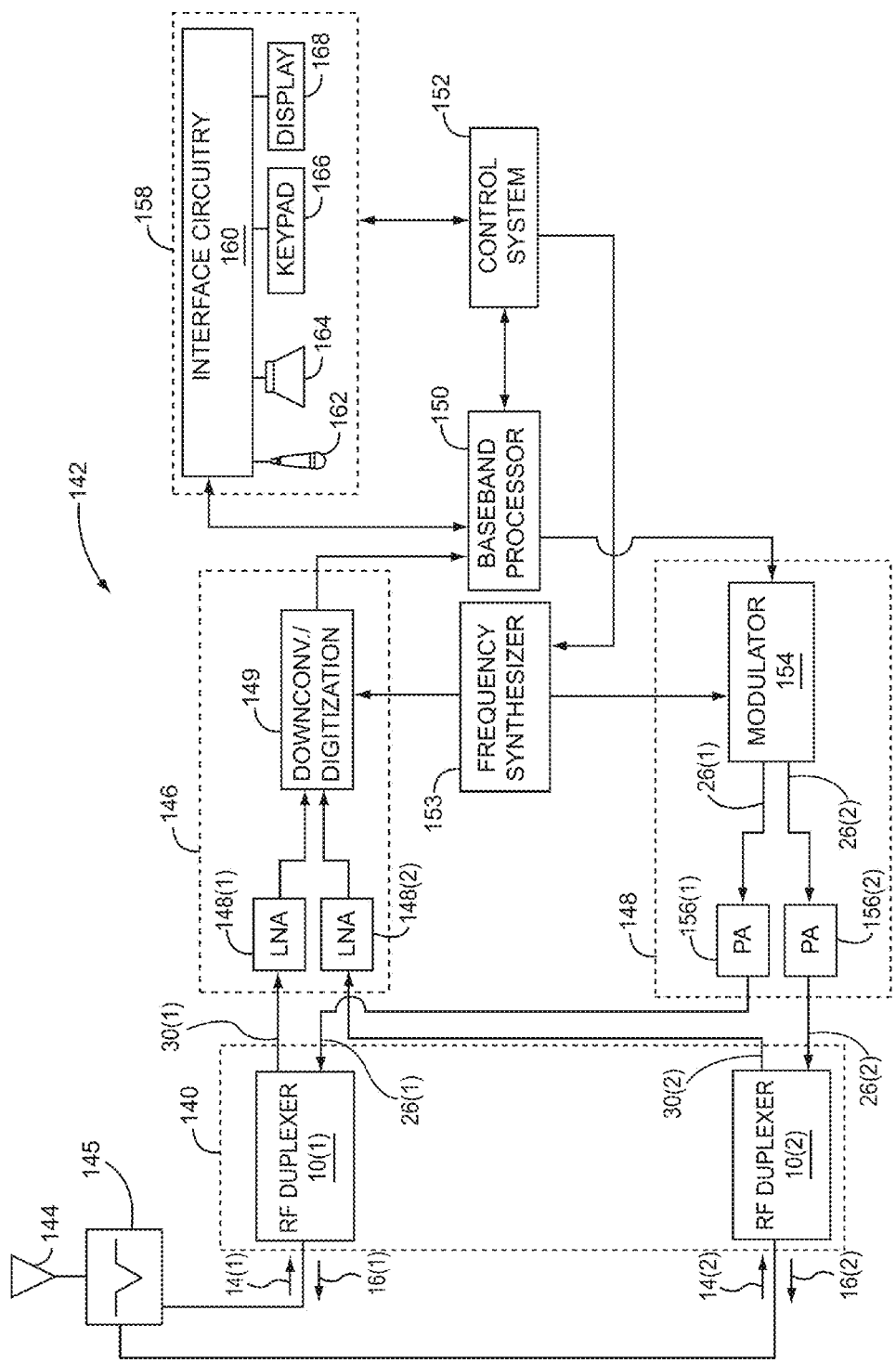
FIG. 11 illustrates one embodiment of a mobile communication device that employs one or more embodiments of the tunable RF duplexers to provide duplexing.

With reference to FIG. 11, an embodiment of an RF duplexer device 140 is incorporated into a mobile communication device 142. The mobile communication device 142 may be any type of mobile communication device, such as a mobile cellular phone, a personal digital assistant (PDA), and/or the like. The RF duplexer device 140 includes a tunable RF duplexer 10(1) and a tunable RF duplexer 10(2). The tunable RF duplexer 10(1) may have any of the configurations described in FIG. 1, 3A, 3B, 5, 7, or 9. The tunable RF duplexer 10(1) is considered to be high-band, and thus may be switched to any one of a plurality of RF communication bands defined between 1.7 GHz and 2.7 GHz. The tunable RF duplexer 10(2) may also have any of the configurations described in FIG. 1, 3A, 3B, 5, 7, 9, or 10. The tunable RF duplexer 10(2) is for low band. In this particular embodiment, the tunable RF duplexer 10(2) may be switched into any one of a plurality of RF communication bands defined from 650 MHz to 1.7 GHz. The RF duplexer device 140 is coupled to a dual-feed (or multiple-feed) antenna 144 and is configured to receive a high-band RF receive input signal 14(1) and output a high-band RF transmission output signal 16(1). The tunable RF duplexer 10(2) is also coupled to the dual-feed (or multiple-feed) antenna 144 and is configured to receive a low-band RF receive input signal 14(2) and output a low-band RF transmission output signal 16(2). A single pole double throw (SP2T) switch 145 is coupled between the antenna 144 and the RF duplexer device 140.

The receiver front end 146 receives information-bearing RF signals from one or more remote transmitters provided by a base station. In this embodiment, the receiver front end 146 has a high-band low-noise amplifier (LNA) 148(1) and a low-band LNA 148(2). The tunable RF duplexer 10(1) outputs a high-band RF receive output signal 30(1) to the high-band LNA 148(1). The tunable RF duplexer 10(2) outputs a low-band RF receive output signal 30(2) to the low-band LNA 148(2). Each LNA 148(1), 148(2) amplifies the respective RF receive output signal 30(1), 30(2). A downconverter 149 downconverts both the high-band RF receive output signal 30(1) and the low-band RF receive output signal 30(2) to intermediate or baseband frequency signals, which are digitized into one or more digital streams. The receiver front end 146 may use various mixing frequencies generated by a frequency synthesizer 152. The baseband processor 150 processes the digitized RF receive signals to extract information or data that is conveyed in the high-band RF receive output signal 30(1) and the low-band RF receive output signal 30(2). This processing typically comprises demodulation, decoding, and error correction operations. As such, the baseband processor 150 is generally implemented in one or more digital signal processors (DSPs).

On the transmit side, the baseband processor 150 receives digitized data from a control system 153, which it encodes for transmission. The encoded data is output to an RF transmitter section 155, where it is used by a modulator 154 to modulate carrier signals at various desired transmit frequencies, and thereby generate a high-band RF transmission input signal 26(1) and a low-band RF transmission input signal 26(2). The modulator 154 provides the high-band RF transmission input signal 26(1) to a high-band power amplifier (PA) 156(1). The modulator 154 provides the low-band RF transmission input signal 26(2) to a low-band PA 156(2). Each of the PAs 156(1), 156(2) provides amplification to the respective RF transmission input signal 26(1), 26(2). The tunable RF duplexer 10(1) receives the high-band RF transmission input signal 26(1) from the high-band PA 156(1). The tunable RF duplexer 10(2) receives the low-band RF receive input signal 26(2) from the low-band PA 156(2).

A user may interact with the mobile communication device 142 via the user interface 158, which may include interface circuitry 160 associated with a microphone 162, a speaker 164, a keypad 166, and a display 168. Alternatively, or additionally, the mobile communication device 142 may include a touchscreen (not shown) for interface with the user. The user interface circuitry 160 typically includes analog-to-digital converters, digital-to-analog converters, amplifiers, and/or the like. Additionally, it may include a voice encoder/decoder, which may communicate directly with the baseband processor 150. The microphone 162 typically converts audio input, such as a user's voice, into an electrical signal, which is digitized and passed directly or indirectly to the baseband processor 150. Audio information encoded in the audio receive signal is recovered by the baseband processor 150 and is converted into an analog suitable for driving the speaker 164. The keypad 166 and the display 168 enable the user to interact with the mobile communication device 142 by inputting numbers to be dialed, retrieving address book information, monitoring call progress information, and/or the like.

Those skilled in the art will recognize improvements and modifications to the embodiments of the present disclosure. All such improvements and modifications are considered within the scope of the concepts disclosed herein and the claims that follow.

What is claimed is:

1. A tunable radio frequency (RF) duplexer comprising:
   a first hybrid coupler operable to split an RF transmission input signal into a first RF quadrature hybrid transmission signal (QHTS) and a second RF QHTS;
   a second hybrid coupler operable to split an RF receive input signal into a first RF quadrature hybrid receive signal (QHRS) and a second RF QHRS;
   an RF filter circuit operable to pass the first RF QHTS and the second RF QHTS to the second hybrid coupler and to reflect the first RF QHRS and the second RF QHRS back to the second hybrid coupler; and
   wherein the second hybrid coupler is configured to combine the first RF QHTS and the second RF QHTS into an RF transmission output signal and to combine the first RF QHRS and the second RF QHRS into an RF receive output signal.

2. The tunable RF duplexer of claim 1, further comprising a tuning circuit wherein:
   the RF filter circuit has a frequency response that defines a passband;
   the RF filter circuit is tunable to shift the passband; and
   the tuning circuit is configured to tune the frequency response so that a signal bandwidth of the first RF QHTS and a signal bandwidth of the second RF QHTS are each within the passband.

3. The tunable RF duplexer of claim 1, further comprising a tuning circuit wherein:
   the RF filter circuit has a frequency response that defines a stopband;
   the RF filter circuit is tunable to shift the stopband; and
   the tuning circuit is configured to tune the frequency response so that a signal bandwidth of the first RF QHRS and a signal bandwidth of the second RF QHRS are each within the stopband.

4. The tunable RF duplexer of claim 1, further comprising a tuning circuit wherein:
   the RF filter circuit has a frequency response that defines a passband and a stopband;
   the RF filter circuit is tunable to shift the passband and shift the stopband; and
   the tuning circuit is configured to tune the frequency response so as to shift the passband so that a signal bandwidth of the first RF QHTS and a signal bandwidth of the second RF QHTS are each within the passband, and to shift the stopband so that a signal bandwidth of the first RF QHRS and a signal bandwidth of the second RF QHRS are each within the stopband.

5. The tunable RF duplexer of claim 4 wherein the frequency response defines the stopband as a notch.

6. The tunable RF duplexer of claim 4, further comprising a second RF filter circuit having a second frequency response that defines a second passband, wherein:
   the second RF filter circuit is operably associated with the second hybrid coupler so as to receive the RF receive output signal;
   the second RF filter circuit is tunable to shift the second passband; and
   the tuning circuit is configured to tune the second frequency response so that a signal bandwidth of the RF receive output signal is within the second passband.

7. The tunable RF duplexer of claim 1, further comprising a tuning circuit wherein:
   the first hybrid coupler is configured to receive the RF transmission input signal as operating in an RF communication band, whereby the first RF QHTS, the second RF QHTS, and the RF transmission output signal each operate in the RF communication band;
   the second hybrid coupler is configured to receive the RF receive input signal as operating within the RF communication band, whereby the first RF QHTS, the second RF QHTS, and the RF receive output signal each operate in the RF communication band;
   the RF filter circuit has a frequency response that defines a passband and a stopband, wherein the RF filter circuit is tunable so as to shift the passband and to shift the stopband; and
   the tuning circuit is configured to tune the frequency response so as to shift the passband within the RF communication band such that the first RF QHTS and the second RF QHTS operating in the RF communication band are passed to the second hybrid coupler, and to shift the stopband in the RF communication band such that the first RF QHRS and the second RF QHRS operating in the RF communication band are reflected back to the second hybrid coupler.

8. The tunable RF duplexer of claim 7, wherein:
   the RF communication band has an RF receive band and an RF transmission band;
   the RF receive input signal, the first RF QHRS, the second RF QHRS, and the RF receive output signal each operate in the RF receive band;
   the RF transmission input signal, the first RF QHTS, the second RF QHTS, and the RF transmission output signal each operate in the RF transmission band; and
   the tuning circuit is configured to shift the passband into the RF transmission band and to shift the stopband into the RF receive band.

9. The tunable RF duplexer of claim 8, wherein:
   the second hybrid coupler is configured to receive a second RF receive signal operating in a second RF receive band within another RF communication band, wherein the second hybrid coupler is configured to split the second RF receive signal into a third RF QHRS and a fourth RF QHRS, whereby each of the third RF QHRS and the fourth RF QHRS operates in the second RF receive band;

the RF filter circuit having the frequency response that further defines a second stopband and being tunable so as to shift the second stopband;

the tuning circuit being further configured to tune the frequency response so as to shift the second stopband in the second RF receive band such that the third RF QHRS and the fourth RF QHRS are reflected back to the second hybrid coupler; and wherein the second hybrid coupler is configured to combine the third RF QHRS and the fourth RF QHRS into a second RF receive output signal that operates in the second RF receive band.

10. The tunable RF duplexer of claim 8, further comprising:

a third hybrid coupler configured to receive a second RF receive input signal operating in a second RF receive band within another RF communication band, wherein the third hybrid coupler is configured to split the second RF receive input signal into a third RF QHRS and a fourth RF QHRS, whereby each of the third RF QHRS and the fourth RF QHRS operate in the second RF receive band;

a second RF filter circuit having a second frequency response that defines a second passband and a second stopband, wherein the second RF filter circuit is tunable to shift the second passband and shift the second stopband;

the tuning circuit is further configured to tune the second frequency response such that the second passband is shifted in the RF transmission band so that the second RF filter circuit passes the first RF QHTS and the second RF QHTS and such that the second stopband is shifted in the second RF receive band so that the second RF filter circuit reflects the third RF QHRS and the fourth RF QHRS back to the third hybrid coupler; and wherein the third hybrid coupler is configured to combine the third RF QHRS and the fourth RF QHRS into a second RF receive output signal that operates in the second RF receive band, and to combine the first RF QHTS and the second RF QHTS into a second RF transmission output signal that operates in the RF transmission band.

11. The tunable RF duplexer of claim 10, wherein:
the first hybrid coupler is further configured to:
output the first RF QHTS at a half power spectral density; and
output the second RF QHTS with a half power spectral density; and
the RF filter circuit and the second RF filter circuit are operably associated such that:
the first RF QHTS is received by the RF filter circuit at a quarter power spectral density;
the second RF QHTS is received by the RF filter circuit at a quarter power spectral density;
the first RF QHTS is received by the second RF filter circuit at a quarter power spectral density;
the second RF QHTS is received by the second RF filter circuit at a quarter power spectral density; and
the RF transmission output signal and the second RF transmission output signal are combined into an aggregated RF transmission output signal.

12. The tunable RF duplexer of claim 7, wherein:
the RF filter circuit is tunable so that the RF communication band can be switched to be any one of a plurality of different RF communication bands; and
the tuning circuit is operable to tune the frequency response of the RF filter circuit such that the passband is shifted to pass the first RF QHTS and the second RF QHTS in response to the RF communication band being switched to a different one of the plurality of different RF communication bands, and the stopband is shifted to reflect the first RF QHRS and the second RF QHRS in response to the RF communication band being switched to the different one of the plurality of different RF communication bands.

13. The tunable RF duplexer of claim 1 wherein the second hybrid coupler has a port, the port being configured to simultaneously receive the RF receive input signal and output the RF transmission output signal.

14. The tunable RF duplexer of claim 1 further comprising a tuning circuit and wherein:
the RF filter circuit has a frequency response that defines a passband and is tunable so as to shift a stopband;
the tuning circuit is configured to tune the RF filter circuit so that a signal bandwidth of the RF transmission input signal is within the passband and so that a signal bandwidth of the RF receive input signal is within the stopband;
the first hybrid coupler has a first port, wherein the first hybrid coupler is configured to receive the RF transmission input signal at the first port; and
the second hybrid coupler has a second port and a third port, wherein the second hybrid coupler is configured to:
receive the RF receive input signal at the second port;
output the RF transmission output signal from the second port; and
output the RF receive output signal from the third port.

15. The tunable RF duplexer of claim 14 further comprising:
a second RF filter circuit coupled to the third port so that the second RF filter circuit is configured to receive the RF receive output signal, wherein the second RF filter circuit has a second frequency response that defines a second passband, the second RF filter circuit being tunable to shift the second passband; and
the tuning circuit further configured to tune the second RF filter circuit so that a signal bandwidth of the RF receive output signal is within the second passband.

16. The tunable RF duplexer of claim 14 wherein, to combine the first RF QHTS and the second RF QHTS into the RF transmission output signal, the second hybrid coupler is further configured to:
pass the second RF QHTS to the second port; and
pass the first RF QHTS to the second port, wherein the second hybrid coupler provides a quadrature phase shift to the first RF QHTS at the second port such that the first RF QHTS is provided substantially as a duplicate of the second RF QHTS at the second port, and the first RF QHTS and the second RF QHTS constructively interfere at the second port to output the RF transmission output signal from the second port.

17. The tunable RF duplexer of claim 16 wherein, to combine the first RF QHRS and the second RF QHRS into the RF receive output signal, the second hybrid coupler is further configured to:
pass the second RF QHRS to the third port;
pass the first RF QHRS to the third port, wherein the second hybrid coupler provides a quadrature phase shift to the first RF QHRS at the third port such that the first RF QHRS is provided substantially as a duplicate of the second RF QHRS at the third port, and the first RF QHRS and the second RF QHRS constructively interfere at the third port to output the RF receive output signal from the third port.

18. The tunable RF duplexer of claim 17 wherein the second hybrid coupler is further configured such that the quadrature phase shift at the second port results in destructive interference between the first RF QHRS and the second RF QHRS, wherein the first RF QHRS and the second RF QHRS are substantially cancelled at the second port, and such that the quadrature phase shift at the third port results in destructive interference between the first RF QHTS and the second RF QHTS at the third port, wherein the first RF QHTS and the second RF QHTS are substantially cancelled at the third port.

19. The tunable RF duplexer of claim 18, further comprising a second RF filter circuit wherein the second RF filter circuit is operable to define a passband and the second RF filter circuit is operably associated with the third port so as to pass the RF receive output signal within the passband to a receiver chain.

20. The tunable RF duplexer of claim 1 wherein:
the first hybrid coupler comprises a first port configured to receive the RF transmission input signal, a second port, and a third port, wherein the first hybrid coupler is configured to:
output the first RF QHTS from the second port in response to the RF transmission input signal being received at the first port; and
output the second RF QHTS from the third port in response to the RF transmission input signal being received at the first port; and
the second hybrid coupler comprises a fourth port configured to receive the first RF QHTS from the RF filter circuit and the second RF QHRS reflected back by the RF filter circuit, a fifth port configured to receive the second RF QHTS from the RF filter circuit and the first RF QHRS reflected back by the RF filter circuit, a sixth port, and a seventh port configured to receive the RF receive input signal, wherein the second hybrid coupler is configured to:
output the RF receive output signal from the sixth port in response to the second RF QHRS being reflected back by the RF filter circuit to the fourth port and the first RF QHRS being reflected back by the RF filter circuit to the fifth port; and
output the RF transmission output signal from the seventh port in response to the second RF QHTS being received from the RF filter circuit at the fourth port and the first RF QHTS being received from the RF filter circuit at the fifth port.

21. The tunable RF duplexer of claim 20 wherein the first hybrid coupler further comprises an eighth port, wherein the first hybrid coupler is configured such that the eighth port is substantially isolated from the first port.

22. The tunable RF duplexer of claim 20 further comprising:
an antenna;
an antenna impedance tuner coupled between the antenna and the seventh port, wherein the antenna impedance tuner is tunable so as to reduce reflections from the antenna to the seventh port.

23. A method of providing RF duplexing, comprising:
splitting an RF transmission input signal into a first RF quadrature hybrid transmission signal (QHTS) and a second RF QHTS;
splitting an RF receive input signal into a first RF quadrature hybrid receive signal (QHRS) and a second RF QHRS;
filtering the first RF QHTS and the second RF QHTS to pass the first RF QHTS and the second RF QHTS within a passband;
filtering the first RF QHRS and the second RF QHRS to reflect the first RF QHRS and the second RF QHTS within a stopband;
combining the first RF QHTS and the second RF QHTS within the passband into an RF transmission output signal; and
combining the first RF QHRS and the second RF QHRS within the stopband into an RF receive output signal.

24. The method of claim 23, further comprising:
receiving the RF receive input signal at a port; and
while the RF receive input signal is being received at the port, outputting the RF transmission output signal from the port.

25. The method of claim 23, further comprising:
tuning the passband to pass the first RF QHTS and the second RF QHTS within the passband; and
tuning the stopband to reflect the first RF QHRS and the second RF QHTS within the stopband.

* * * * *